(12) United States Patent
Hasegawa et al.

(10) Patent No.: US 11,877,392 B2
(45) Date of Patent: Jan. 16, 2024

(54) FLEXIBLE WIRING BOARD, MODULE, AND ELECTRONIC DEVICE

(71) Applicant: CANON KABUSHIKI KAISHA, Tokyo (JP)

(72) Inventors: Mitsutoshi Hasegawa, Kanagawa (JP); Yuya Okada, Shizuoka (JP); Satoru Higuchi, Tokyo (JP); Koji Noguchi, Tokyo (JP)

(73) Assignee: CANON KABU KIKA HA KAISHA, Tokyo (JP)

( * ) Notice: Subject to any disclaimer, the term of this patent is extended or adjusted under 35 U.S.C. 154(b) by 105 days.

(21) Appl. No.: 17/725,803

(22) Filed: Apr. 21, 2022

(65) Prior Publication Data

US 2022/0346219 A1   Oct. 27, 2022

(30) Foreign Application Priority Data

Apr. 26, 2021 (JP) .................................. 2021-074465

(51) Int. Cl.
*H05K 1/18* (2006.01)
*H05K 1/02* (2006.01)

(52) U.S. Cl.
CPC ... *H05K 1/028* (2013.01); *H05K 2201/09063* (2013.01)

(58) Field of Classification Search
CPC ..................... H05K 1/028; H05K 2201/09063
USPC ......................................................... 361/749
See application file for complete search history.

(56) References Cited

U.S. PATENT DOCUMENTS

| 9,421,628 B2 | 8/2016 | Higuchi |
| 10,582,615 B2 | 3/2020 | Noguchi |
| 10,897,820 B2 | 1/2021 | Noguchi |
| 2020/0113056 A1 | 4/2020 | Hasegawa |
| 2020/0236261 A1 | 7/2020 | Okada |

(Continued)

FOREIGN PATENT DOCUMENTS

| JP | 2009-36859 A | 2/2009 |
| JP | 2009-141129 A | 6/2009 |

(Continued)

OTHER PUBLICATIONS

U.S. Appl. No. 17/668,461, filed Feb. 10, 2022, by Tomohisa Ishigami, et al.

(Continued)

*Primary Examiner* — Binh B Tran
(74) *Attorney, Agent, or Firm* — VENABLE LLP

(57) ABSTRACT

A flexible wiring board includes: an insulator; a wiring layer supported by the insulator; a first terminal unit including connection terminals provided at one end of the wiring layer; and a second terminal unit including connection terminals provided at the other end. A portion of the wiring layer from a part adjacent to the first terminal unit to a part adjacent to the second terminal unit is provided between first and second insulator layers included in the insulator. First and second holes formed in the first or second insulator layer are provided in an intermediate portion in a first direction from the first terminal unit to the second terminal unit and are spaced apart from each other in the first direction, and an insulator region adjacent to the first hole in a second direction is adjacent to at least a part of the second hole in the first direction.

25 Claims, 34 Drawing Sheets

(56) References Cited

U.S. PATENT DOCUMENTS

| | | |
|---|---|---|
| 2021/0022255 A1 | 1/2021 | Yosui |
| 2021/0320142 A1 | 10/2021 | Noguchi |
| 2022/0020807 A1 | 1/2022 | Hasegawa |
| 2022/0046785 A1* | 2/2022 | Kang ................. H01L 23/3677 |

FOREIGN PATENT DOCUMENTS

| | | |
|---|---|---|
| JP | 2009-295821 A | 12/2009 |
| JP | 2010-239109 A | 10/2010 |
| JP | 2011-238857 A | 11/2011 |

OTHER PUBLICATIONS

U.S. Appl. No. 17/220,711, filed Apr. 1, 2021, by Koji Noguchi, et al. (Abandoned).

\* cited by examiner

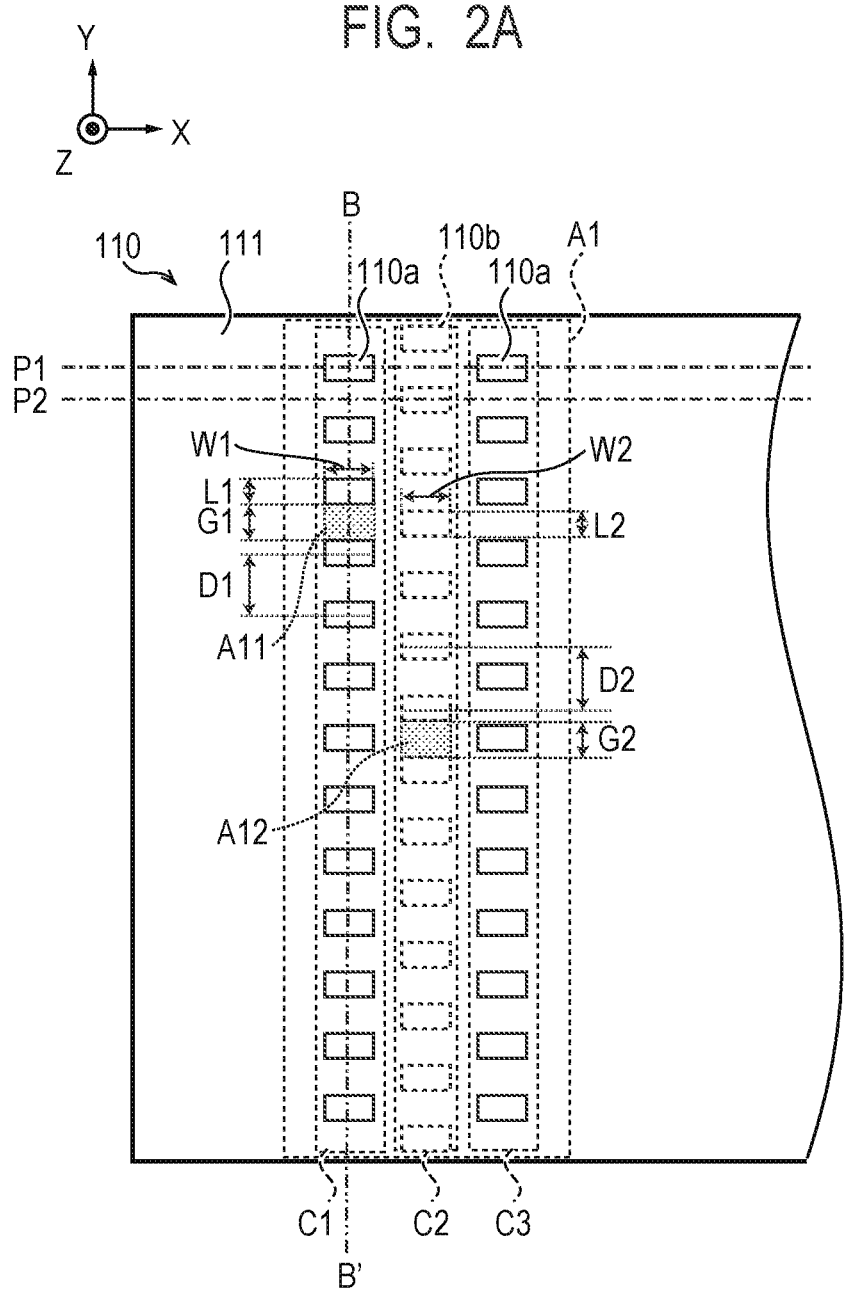

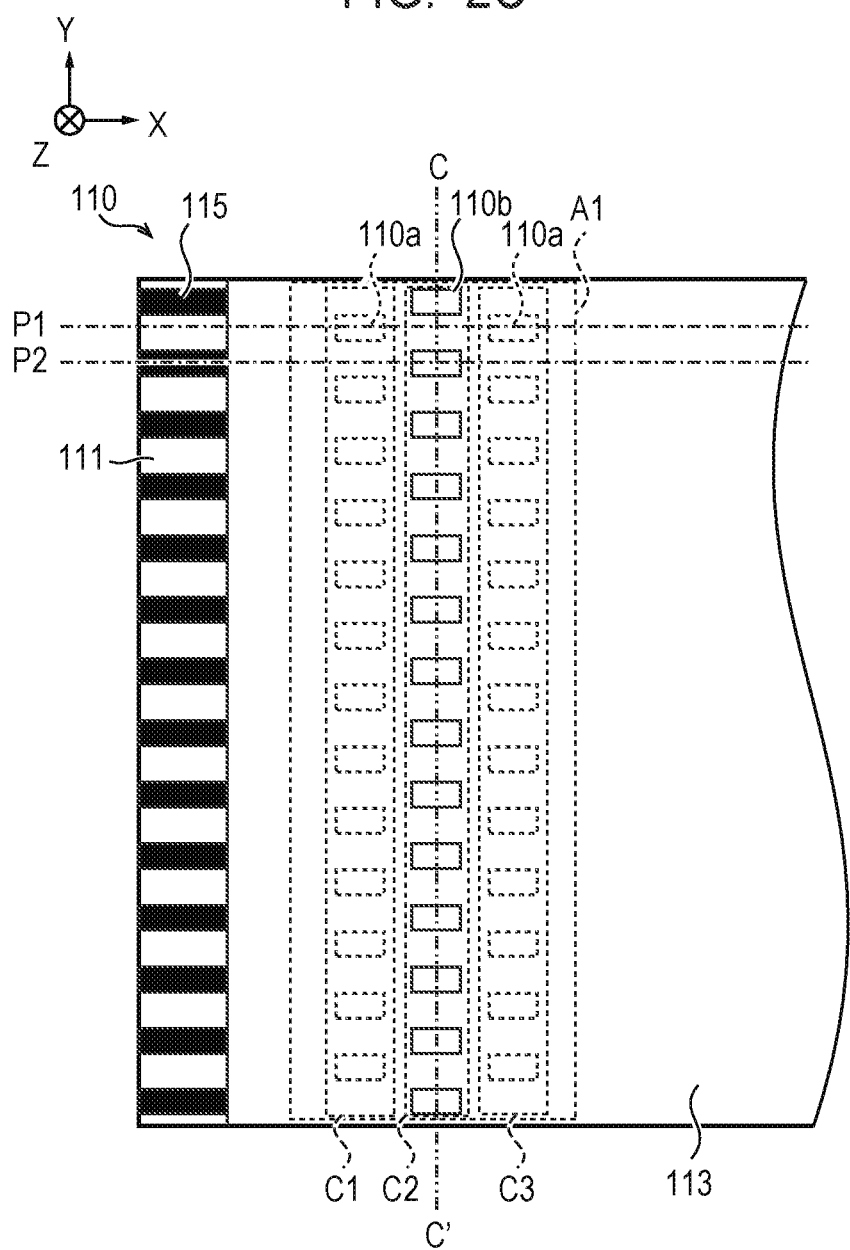

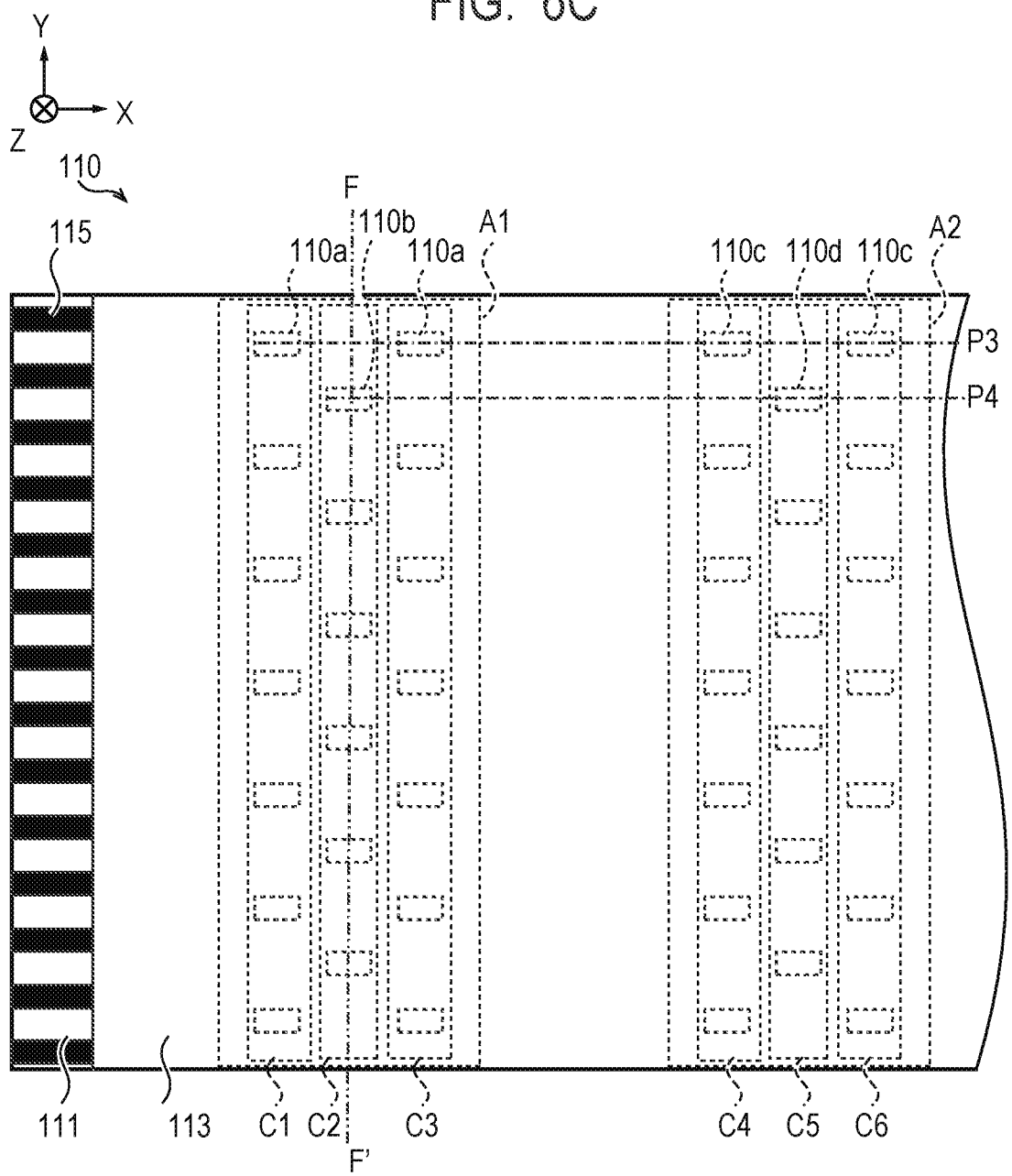

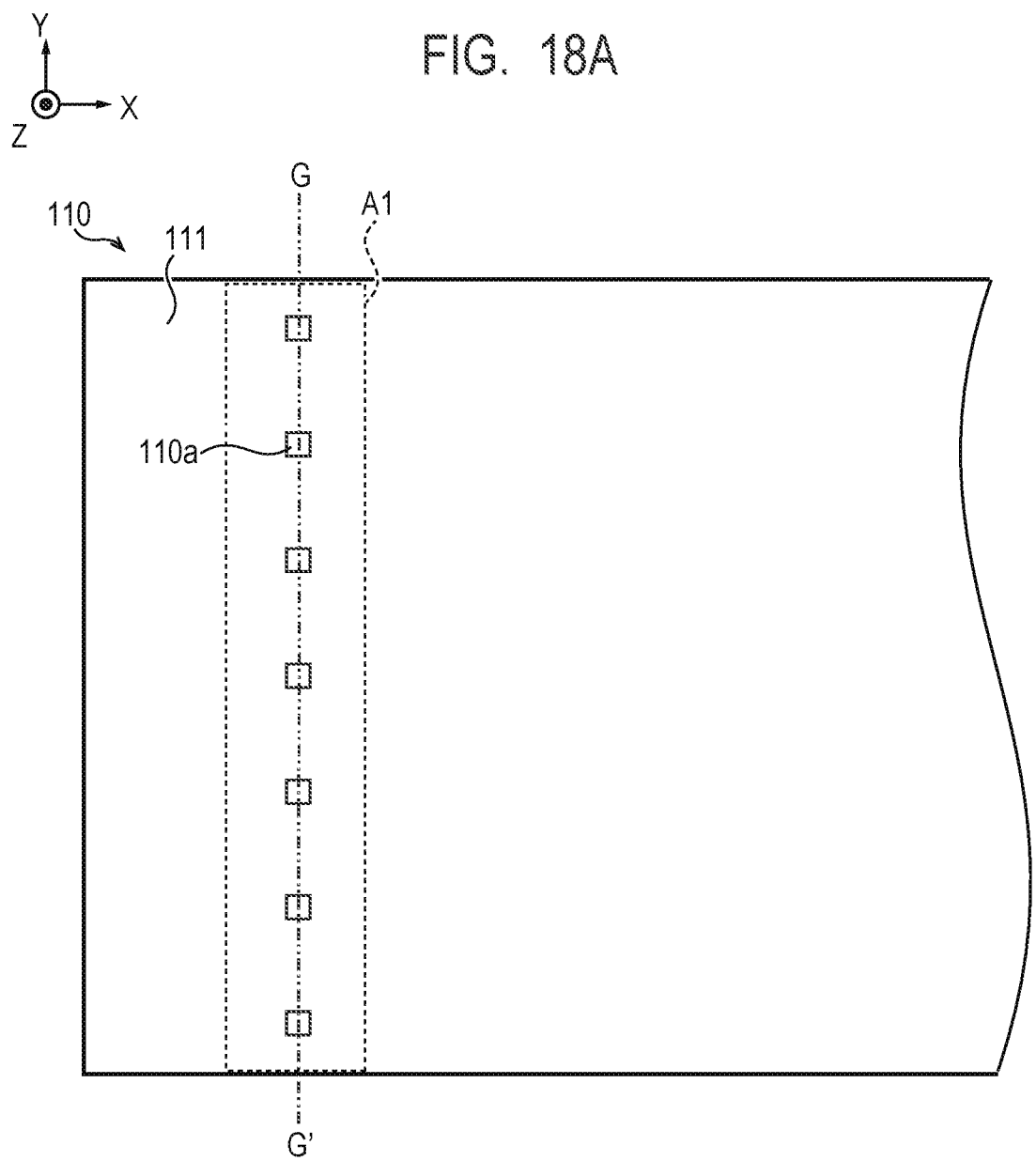

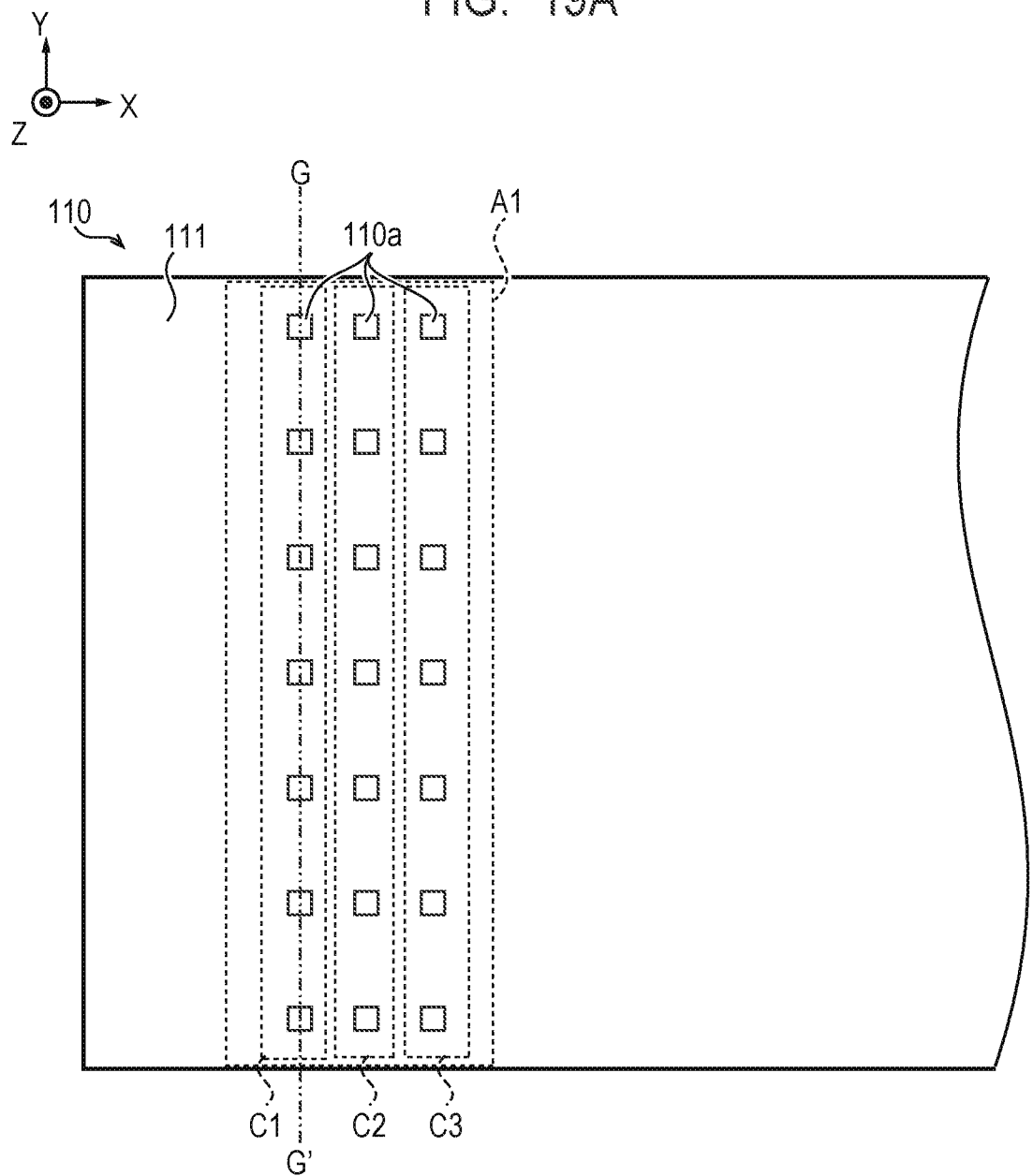

FLEXIBLE WIRING BOARD, MODULE, AND ELECTRONIC DEVICE

BACKGROUND OF THE INVENTION

Field of the Invention

The present invention relates to a flexible wiring board, a module, and an electronic device.

Description of the Related Art

Japanese Patent Application Laid-Open No. 2009-295821 proposes structure of a composite substrate having interconnection structure between substrates. The composite substrate disclosed in Japanese Patent Application Laid-Open No. 2009-295821 has a first flexible wiring board in which a reinforcement board is stacked on a first surface and a second flexible wiring board joined on a second surface of the first flexible wiring board. Further, the reinforcement board has a portion protruding from an end face of the first flexible wiring board so as to overlap the joining part between the first and second flexible wiring boards.

Further, in the composite substrate disclosed in Japanese Patent Application Laid-Open No. 2009-295821, wiring patterns of the first and second flexible wiring boards are electrically interconnected at the joining part, and the reinforcement board and the second flexible wiring board are fixed to each other by an adhesive agent. This can prevent disconnection of an exposed part of wiring patterns due to a bending stress.

In the art disclosed in Japanese Patent Application Laid-Open No. 2009-295821, the strength of the flexible wiring board is enhanced by the reinforcement board, but on the other hand, the flexibility of the flexible wiring board is impaired. Thus, a stress may be applied to a connection part that connects the flexible wiring board to a connecting target such as a printed circuit board.

In contrast, if the flexibility of a flexible wiring board is too high, the flexible wiring board will slacken and come into contact with an electronic component or the like therearound. Thus, flexible wiring boards are required to have both high flexibility and high strength.

Accordingly, the present invention intends to provide a technology useful in achieving both high flexibility and high strength in a flexible wiring board.

SUMMARY OF THE INVENTION

According to one aspect of the present invention, provided is a flexible wiring board including: an insulator; and a wiring layer supported by the insulator, and the flexible wiring board further has: a first terminal unit including a plurality of connection terminals provided at one end of the wiring layer; and a second terminal unit including a plurality of connection terminals provided at the other end of the wiring layer, the insulator includes a first insulator layer and a second insulator layer, a portion of the wiring layer from a part adjacent to the first terminal unit to a part adjacent to the second terminal unit is provided between the first insulator layer and the second insulator layer, a first hole and a second hole formed in the first insulator layer or the second insulator layer are provided in an intermediate portion in a first direction from the first terminal unit to the second terminal unit, the first hole and the second hole are spaced apart from each other in the first direction, and an insulator region adjacent to the first hole in a second direction intersecting the first direction is adjacent to at least a part of the second hole in the first direction.

Further features of the present invention will become apparent from the following description of exemplary embodiments with reference to the attached drawings.

BRIEF DESCRIPTION OF THE DRAWINGS

FIG. 2A is a top view of a hole forming region of a flexible wiring board before mounted on the imaging module according to the first embodiment.

FIG. 2C is an underside view of the hole forming region of the flexible wiring board illustrated in FIG. 1.

FIG. 6C is an underside view of the hole forming regions of the flexible wiring board illustrated in FIG. 5.

FIG. 18A is a top view illustrating a general configuration of a flexible wiring board according to Analysis example 2.

FIG. 19A is a top view illustrating a general configuration of a flexible wiring board according to Analysis example 3.

DESCRIPTION OF THE EMBODIMENTS

Embodiments of the present invention will be described below in detail with reference to the drawings. Note that the present invention is not limited to the following embodiments and can be modified as appropriate within the scope not departing from the spirit thereof. Further, throughout the drawings described below, components having the same function are labeled with the same references, and the description thereof may be omitted or simplified. Note that the term "hole" in this specification is used to mean both a bottomed hole and a bottomless hole. Further, the term "through hole" means a hole penetrating a single member or a composite member. The "through hole" may encompass both cases where a bottom of a through hole penetrating a single member or a composite member is formed of a separate member and thereby the through hole is a bottomed hole and where the through hole is a bottomless hole.

First Embodiment

Figure 1:
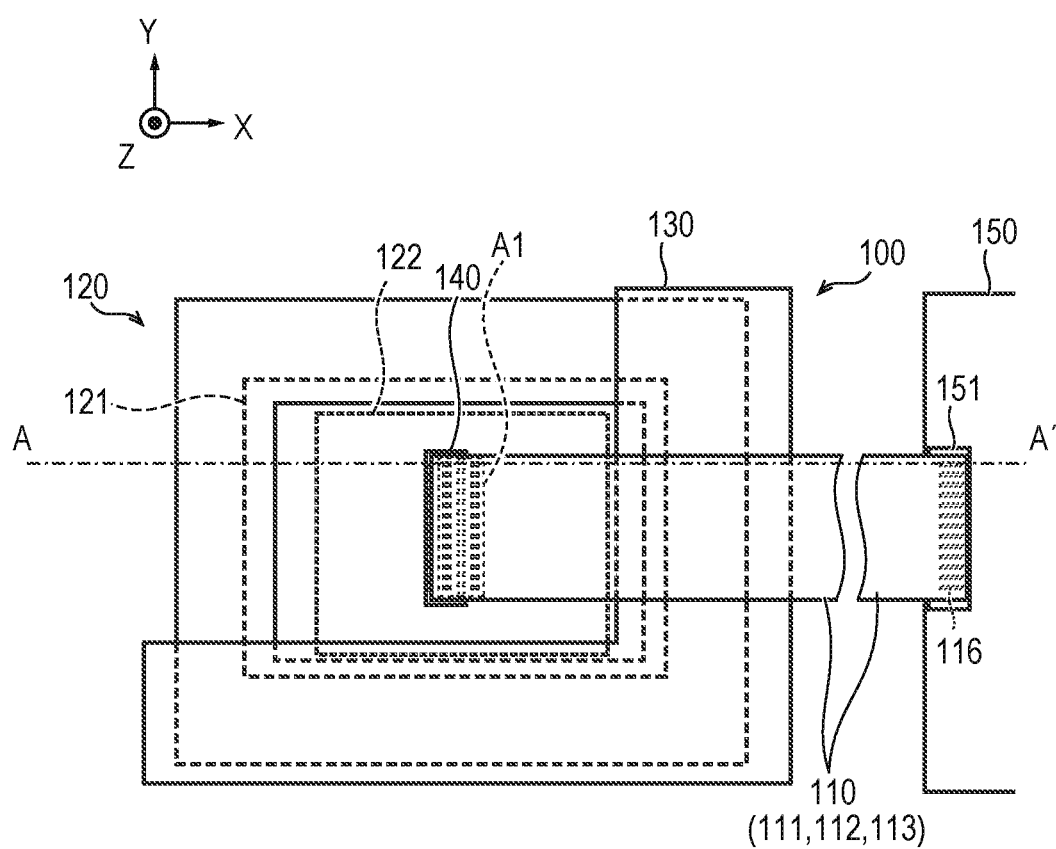
FIG. 1 is a top view illustrating a general configuration of an imaging module according to a first embodiment.
Figure 2B:
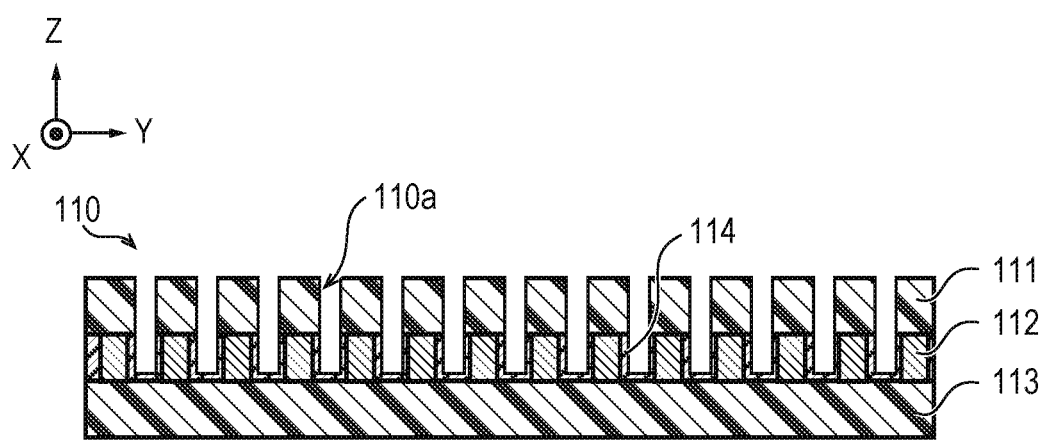
FIG. 2B is a sectional view taken along a line B-B' illustrated in FIG. 2A.

The connection structure between a flexible wiring board 110 and a printed wiring board 121 in an imaging module 100 according to a first embodiment will be described with reference to FIG. 1, FIG. 2A to FIG. 2D, FIG. 3, and FIG. 4. FIG. 1 is a top view illustrating the general configuration of the imaging module 100 according to the present embodiment. FIG. 2A is a top view of a hole forming region A1 of the flexible wiring board 110 of the imaging module 100 illustrated in FIG. 1. FIG. 2B is a sectional view taken along the line B-B' illustrated in FIG. 2A.

Figure 2D:
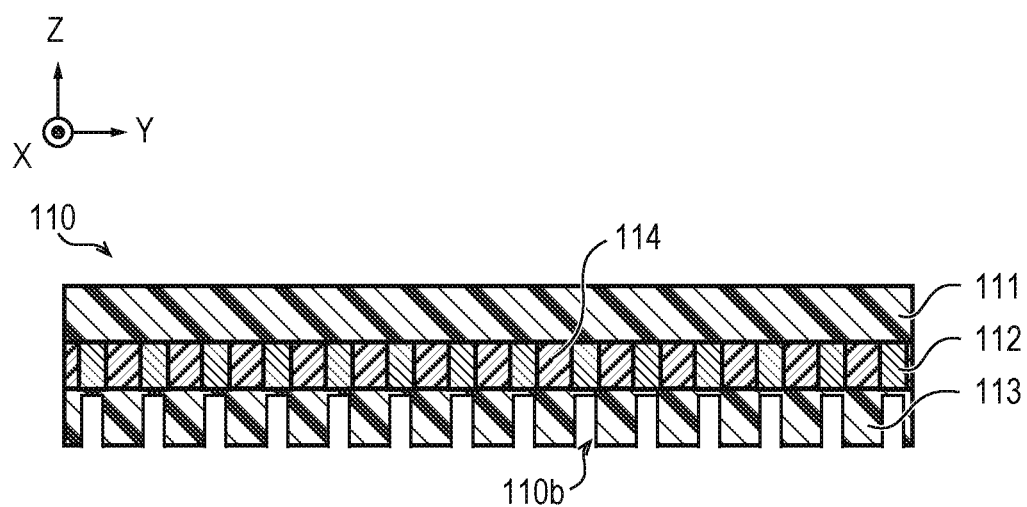
FIG. 2D is a sectional view taken along a line C-C' illustrated in FIG. 2C.
Figure 3:
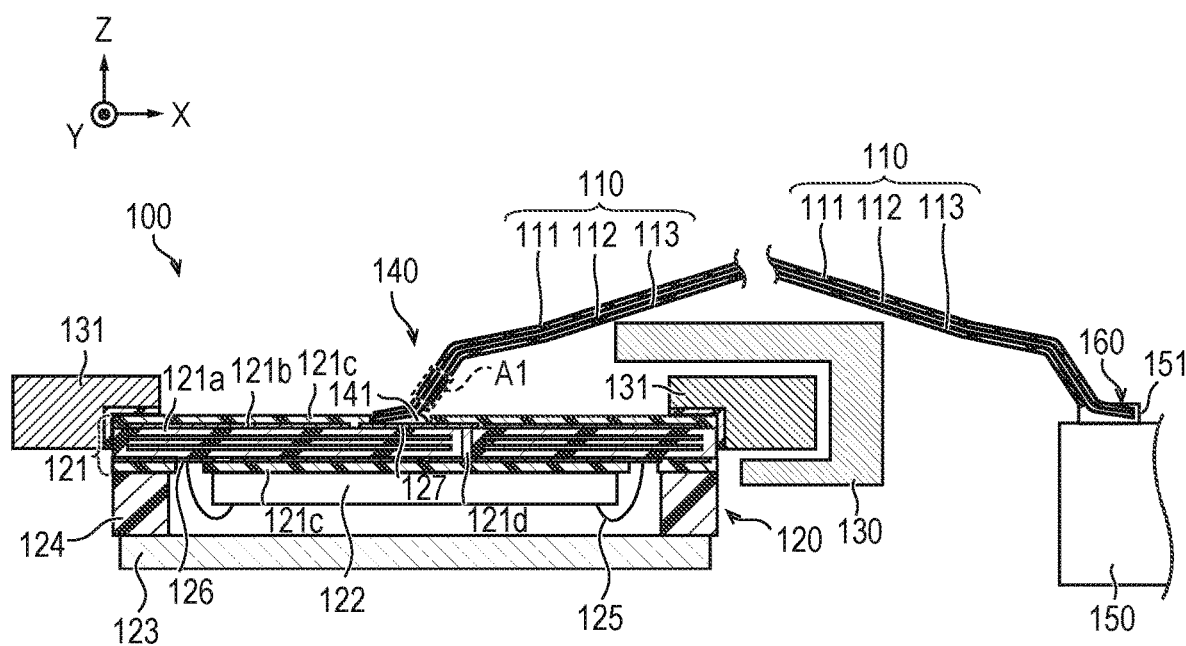
FIG. 3 is a sectional view taken along a line A-A' illustrated in FIG. 1.
Figure 4:
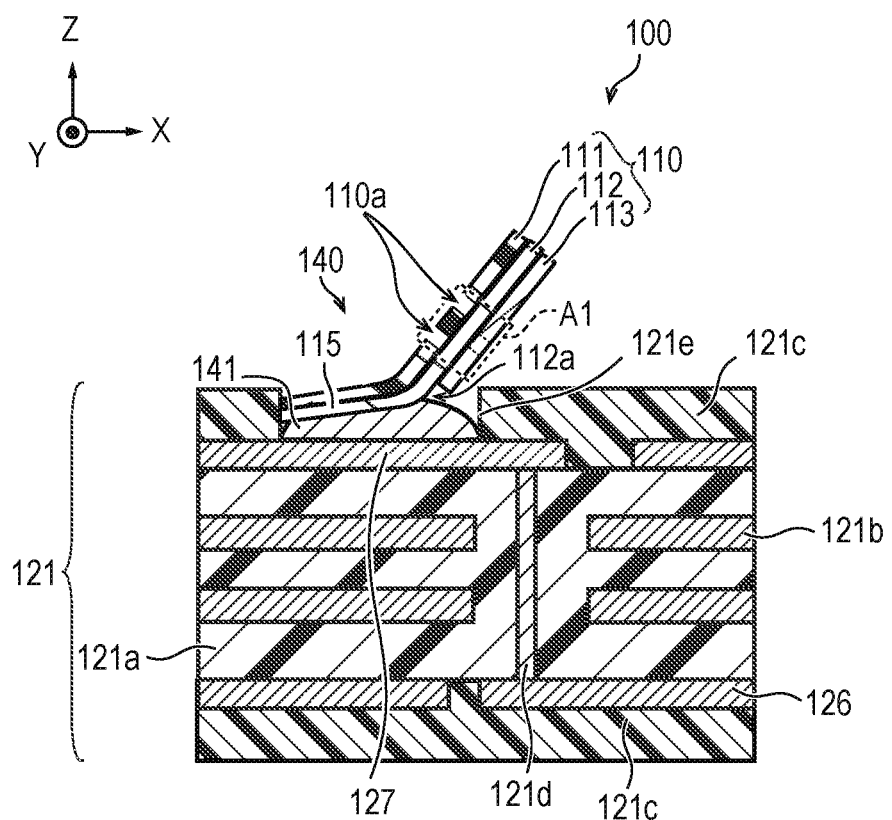
FIG. 4 is an enlarged sectional view of a main part of the imaging module illustrated in FIG. 3.

FIG. 2C is an underside view of the hole forming region A1 of the flexible wiring board 110 illustrated in FIG. 1. FIG. 2D is a sectional view taken along the line C-C' illustrated in FIG. 2C. FIG. 3 is a schematic sectional view illustrating the general configuration of the imaging module 100 according to the present embodiment, which is a sectional view taken along the line A-A' illustrated in FIG. 1. FIG. 4 is an enlarged sectional view of a main part of the imaging module 100 illustrated in FIG. 3.

As illustrated in FIG. 1 and FIG. 3, the imaging module 100 has a flexible wiring board 110, a sensor unit 120, an image stabilizer unit 130, and an image processing unit 150.

Definitions for respective coordinate axes of an X-axis, a Y-axis, and a Z-axis of an XYZ coordinate system that is a rectangular coordinate system and respective directions used in the following description will now be described. First, the axis perpendicular to the primary surface of a printed wiring board 121 of a sensor unit 120 is defined as the Z-axis. Further, the axis parallel to the primary surface of the printed wiring board 121 and parallel to a pair of edges parallel to each other of the printed wiring board 121 is defined as the X-axis. Further, the axis orthogonal to the X-axis and the Z-axis is defined as the Y-axis. In the XYZ coordinate system whose coordinate axes are defined in such a way, directions along the X-axis are defined as X directions, and one of the X directions that runs from one end of the flexible wiring board 110 on a connection part 140 side to the other end is defined as a +X direction, and the opposite direction to the +X direction is defined as a −X direction. Further, directions along the Y-axis are defined as Y directions, and one of the Y directions that runs from the right side to the left side with respect to the +X direction is defined as a +Y direction, and the opposite direction to the +Y direction is defined as a −Y direction. Further, directions along the Z-axis are defined as Z directions, and one of the Z directions that runs from an imaging sensor device 122 side of the sensor unit 120 to the connection part 140 side is defined as a +Z direction, and the opposite direction to the +Z direction is defined as a −Z direction. Further, the rotation direction about the Z-axis is defined as a θ direction.

Further, as illustrated in FIG. 1, FIG. 2B, and FIG. 2D, the flexible wiring board 110 has a flexible base material 111, a flexible wiring layer 112, and a cover lay 113. The flexible wiring board 110 has one or more conductor layers as the flexible wiring layer 112 and is formed such that the conductor layers are stacked via the flexible base material 111 as an insulating layer. Note that, although a case where the wiring layer in the flexible wiring board 110 is formed of a single layer will be described in the present embodiment, the wiring layer may be formed of multiple layers without being limited to a single layer. Further, in the present embodiment, the flexible base material 111 and the cover lay 113 may be collectively called an "insulator". The "insulator" may be a single-layer structure in which only the flexible base material 111 serves as an insulator layer or may have a multilayer structure of a plurality of insulator layers in which the flexible base material 111 and the cover lay 113 serve as insulator layers, respectively. The number of layers of the insulator layers in an insulator having multilayer structure may be three or greater.

The flexible base material 111 is, for example, a sheet-like or film-like insulating base material made of a resin or the like and has plasticity and flexibility. Thus, the flexible wiring board 110 having the flexible base material 111 can be deformed such as be bent. The insulator forming the flexible base material 111 can have an electric insulation property. For example, polyimide, polyethylene terephthalate, or the like may be used as an insulator forming the flexible base material 111.

The flexible wiring layer 112 is a conductor layer formed of a copper foil, other metal foils, or the like. The flexible wiring layer 112 has a predetermined wiring pattern. The flexible wiring layer 112 is formed on one side or both sides of the flexible base material 111. The conductor forming the flexible wiring layer 112 is made of a substance having higher electrical conductivity and higher heat conductivity than the insulator, which may be, for example, a metal such as copper, silver, gold, or the like. Note that the flexible wiring layer 112 is formed on at least one side of the flexible base material 111.

The cover lay 113 is an insulating layer that protects a circuit formed by the flexible wiring layer 112. The cover lay 113 is formed of a cover film or the like. Polyimide, polyethylene terephthalate, or the like may be used as the insulator such as a cover film of the cover lay 113.

The cover film serving as the cover lay 113 is formed such that the flexible base material 111 and the flexible wiring layer 112 are attached to each other by an adhesive agent 114 and the adhesive agent 114 covers the flexible wiring layer 112. The adhesive agent 114 has an electric insulation property. For example, an epoxy-based adhesive agent, a silicone-based adhesive agent, or the like may be used. The cover lay 113 may be formed by overcoat or the like to cover the flexible wiring layer 112 on the surface on which the flexible wiring layer 112 of the flexible base material 111 is formed.

In the flexible wiring board 110 of the present embodiment, holes are formed in a hole forming region A1 by machine processing using a laser processing machine, a drill, or a punching before the flexible wiring board 110 is connected to the printed wiring board 121. Since a burr or a scratch may occur at a processed end in the case of machine processing, laser processing is more preferable. Further, in the case of laser processing, $CO_2$ laser, UV laser, excimer laser, or the like may be selected as appropriate in accordance with the flexible base material 111 or the base material of the cover lay 113. In the present embodiment, at least two or more columns of holes are formed in the hole forming region A1. Further, each hole in the present embodiment is a bottomed hole, which may be replaced with a bottomless hole.

Further, as illustrated in FIG. 2C, the cover lay 113 is not formed at one end edge of the flexible wiring board 110, and the flexible wiring layer 112 is exposed. The exposed part of the flexible wiring layer 112 forms first electrodes 115.

Further, plating of gold or the like may be coated on the first electrodes 115. A plurality of first electrodes 115 are arranged at a predetermined pitch, for example.

In such a way, the first electrodes 115 are formed of the flexible wiring layer 112 exposed at the end edge of the flexible wiring board 110. A first terminal unit including a plurality of connection terminals (first electrodes 115) are provided to one end edge of the flexible wiring board 110 on which the first electrodes 115 are formed.

Further, as illustrated in FIG. 1, the imaging module 100 has the flexible wiring board 110, a sensor unit 120 (first unit) connected to one end of the flexible wiring board 110, and an image processing unit 150 (second unit) connected to the other end of the flexible wiring board 110. Further, as illustrated in FIG. 3 and FIG. 4, at the connection part 140 between the printed wiring board 121 of the sensor unit 120 (first unit) and the flexible wiring board 110, the first electrodes 115 exposed on one end edge of the flexible wiring board 110 are connected to second electrodes 127 of the printed wiring board 121 by solder 141. The solder 141 is an example of a conductive adhesive agent. The flexible wiring board 110 and the printed wiring board 121 are reliably connected to each other by the solder 141 in contact with the first terminal unit provided to the flexible wiring layer 112. Instead of the solder 141, a conductive adhesive agent such as an anisotropic conductive film (ACF) may be used. Further, instead of the conductive adhesive agent such as the solder 141, a connector may be used for connection between the sensor unit 120 and the flexible wiring board 110.

That is, the first terminal unit of the flexible wiring board 110 can also be inserted in a connector mounted on the printed wiring board 121 of the sensor unit 120, for example. Since connection using the solder 141 may be stronger than other connection forms, achieving both flexibility and strength in the flexible wiring board 110 is more suitable when the solder 141 is used.

Note that a clearance is formed between the cover lay 113 of the flexible wiring board 110 connected to the printed wiring board 121 at the connection part 140 and the solder 141, and it is desirable that an exposed part 112a of the flexible wiring layer 112 be spaced apart from the printed wiring board 121. In the example illustrated in FIG. 4, the end of the flexible wiring board 110 is in contact with (abuts against) a solder resist layer 121c, and this may facilitate positioning of the flexible wiring board 110.

As with FIG. 8 described later, however, the end of the flexible wiring board 110 may be spaced apart from the solder resist layer 121c, or the end of the flexible wiring board 110 may not be in contact with (abut against) the solder resist layer 121c. A clearance may be provided between the end of the flexible wiring board 110 and the solder resist layer 121c. Further, a solid such as the solder 141 or a reinforcing resin (not illustrated) may be provided between the end of the flexible wiring board 110 and the solder resist layer 121c.

Further, as illustrated in FIG. 1, a plurality of second connection terminals 116 are formed of the flexible wiring layer 112 exposed at the end edge of the flexible wiring board 110 and aligned at a predetermined interval on the other end edge of the flexible wiring board 110. That is, the second terminal unit including connection terminals (insertion terminals) whose electrodes are formed of the flexible wiring layer 112 is provided to the other end edge of the flexible wiring board 110. The other connection terminals of the flexible wiring board 110 are inserted in the connector 151 mounted on a printed wiring board of an image processing unit 150 (second unit), for example. In such a way, the flexible wiring board 110 electrically connects the sensor unit 120 and the image processing unit 150 to each other in the imaging module 100.

Further, as illustrated in FIG. 1 and FIG. 3, the hole forming regions A1 and A2 in which a plurality of holes are aligned are provided to the insulator layer (the flexible base material 111 and the cover lay 113) of the flexible wiring layer 112 in an intermediate part in the X direction (first direction) from the first terminal unit, which includes a plurality of connection terminals provided to one end of the flexible wiring layer 112, to the second terminal unit, which includes the plurality of second connection terminals 116 provided to the other end. Further, in the flexible wiring layer 112, a portion from the part adjacent to the first terminal unit to a part adjacent to the second terminal unit is provided between the flexible base material 111 and the cover lay 113. That is, the insulator layer provided with holes extends from a part near the first terminal unit to a part near the second terminal unit.

As illustrated in FIG. 3, the sensor unit 120 has the printed wiring board 121, the imaging sensor device 122, a cover glass 123, a frame 124, metal wires 125, and wiring pads 126. The printed wiring board 121 is adhered and fixed to the frame 124 by an adhesive agent such as a UV curable resin, for example. The sensor unit 120 (first unit) is supported by the image stabilizer unit 130 movably with respect to the image stabilizer unit 130 (third unit), as described later.

One side of the printed wiring board 121 that is the side connected to the flexible wiring board 110 is provided with the second electrode 127 on the surface layer, as described later. The frame 124 is attached to the circumferential edge of the other side of the printed wiring board 121. The cover glass 123 is attached to the bottom side of the frame 124 so as to be parallel to the printed wiring board 121.

The imaging sensor device 122 is an imaging device formed of a semiconductor device, for example. Specifically, the imaging sensor device 122 is a solid state imaging device such as a complementary metal oxide semiconductor (CMOS) image sensor, a charge coupled device (CCD) image sensor, or the like, for example. The imaging sensor device 122 is attached to the printed wiring board 121 so as not to be in contact with the cover glass 123 in a hollow surrounded by the printed wiring board 121, the cover glass 123, and the frame 124. The imaging sensor device 122 is electrically connected to the wiring pads 126 of the printed wiring board 121 through the metal wires 125. Each wiring pad 126 is Au-plated, for example.

The image stabilizer unit 130 supports the sensor unit 120 fixed by a frame 131 movably in the X direction and the Y direction and rotatably in the 0 direction. The image stabilizer unit 130 can compensate a camera shake by moving or rotating the sensor unit 120 in accordance with the camera shake. For example, the image stabilizer unit 130 has an L-shape and is configured to support the frame 131 having a rectangular external shape from adjacent two edges of the frame 131.

Note that, although the case where the frame 131 is attached is described in the present embodiment, the arranged position is not limited to the circumferential edge of the printed wiring board 121. Further, the arranged position of the imaging sensor device 122 may be inside a hollow of the printed wiring board 121 having a counterbore, such as a cavity substrate, for example. Further, although not illustrated, minimal components required for the operation of the imaging module 100 are mounted on the printed wiring board 121.

Further, as illustrated in FIG. 4, the printed wiring board 121 has a printed wiring base material 121a, wiring layers 121b, and the solder resist layer 121c. The printed wiring board 121 is formed such that a plurality of wiring layers 121b are stacked via the printed wiring base material 121a. Unlike the flexible wiring board 110, the printed wiring board 121 is a rigid wiring board.

For example, the printed wiring board 121 may be formed of a glass epoxy material or may be formed of a ceramic substrate. Further, a printed circuit board in which the imaging sensor device 122 is arranged on a ceramic substrate and the ceramic substrate and the printed wiring board 121 are connected via a pair of electrodes by the solder 141 may be used. For example, a land grid array (LGA) type or ceramic leadless chip carrier (CLCC) type sensor unit 120 can also be used.

Note that, although a case where the wiring layers 121b in the printed wiring board 121 are of four layers is described in the present embodiment, the number of layers is not limited to four. A single layer or multiple layers may be employed to form the wiring layer or layers 121b in the printed wiring board 121. That is, the number of wiring layers 121b may four or less or may be four or greater.

The printed wiring base material 121a is, for example, a substrate-like insulating base material made of a hard composite material or the like. Unlike the flexible base material 111, the printed wiring base material 121a is hard. The insulator forming the printed wiring base material 121a may have an electric insulating property. For example, the printed wiring base material 121a may be a resin substrate of a cured resin such as an epoxy resin or a ceramic substrate using ceramic.

The wiring layer 121b is a conducting layer formed of a copper foil, other metal foils, or the like. The wiring layer 121b has a wiring pattern. The wiring layers 121b are formed on one side or both sides of the printed wiring base material 121a. Further, one or multiple layers of the wiring layers 121b are also formed inside the printed wiring base material 121a. FIG. 4 illustrates a case where four layers in total of the wiring layers 121b are formed on both sides and the inside of the printed wiring base material 121a. Further, a via 121d electrically connected between the wiring layers 121b is formed inside the printed wiring base material 121a. Each conductor of the wiring layers 121b, the via 121d, and the like is made of a substance having higher electrical conductivity and higher heat conductivity than the insulator, which may be, for example, a metal such as copper, gold, or the like.

The solder resist layer 121c is an insulating protective film that protects a circuit formed by the wiring layers 121b. The solder resist layer 121c is formed of a cured liquid solder resist, a film-like solder resist, or the like. The solder resist layer 121c is formed so as to cover the wiring layer 121b on one side of the printed wiring board 121 that is the side connected to the flexible wiring board 110. Further, the solder resist layer 121c is also formed so as to cover the wiring layer 121b on the other side that is the side to which the imaging sensor device 122 of the printed wiring board 121 is attached.

An opening 121e exposing the wiring layer 121b is formed in the solder resist layer 121c located on the flexible wiring board 110 side. The exposed part of the wiring layer 121b forms the second electrode 127. The plurality of second electrodes 127 are arranged at a predetermined pitch, for example. Further, the second electrodes 127 is arranged at the center of the printed wiring board 121, for example. The first electrode 115 of the flexible wiring board 110 is electrically connected to on the second electrode 127 by the solder 141.

Note that, when the solder 141 is used to connect the first electrode 115 and the second electrode 127 to each other, the first electrode 115 and the second electrode 127 can be adhered to the solder 141 and connected to each other with a connecting material having the solder 141 being heated above the melting point of the solder 141. Further, the solder 141 may be, for example, Sn-3.0Ag-0.5Cu solder or pasted solder of Sn-58Bi combined with flux. The solder 141 may be heated by electromagnetic induction heating. Further, to connect the first electrode 115 and the second electrode 127 to each other, it is possible to use a conductive adhesive agent such as an anisotropic conductive film (ACF) instead of the solder 141.

Next, the holes formed in the surfaces of the flexible base material 111 and the cover lay 113 of the flexible wiring board 110 will be described in detail with reference to FIG. 2A to FIG. 2D.

In FIG. 2A and FIG. 2C, a range of the hole forming region A1 in which a plurality of holes are aligned in the Y direction and ranges of the first column C1, the second column C2, and the third column C3 inside the hole forming region A1 are illustrated by dashed lines over the flexible base material 111 of the flexible wiring board 110.

A plurality of holes 110a are aligned at a predetermined pitch and a predetermined phase on the first column C1. Similarly, a plurality of holes 110b are aligned at a predetermined pitch and a predetermined phase on the second column C2. A plurality of holes 110a are aligned at a predetermined pitch and a predetermined phase on the third column C3. The holes 110a and the holes 110b are formed in the Y direction in the surface of the flexible wiring board 110 that corresponds to the XY plane. In the present embodiment, the "phase" of holes means positions of the holes in the Y direction. Further, the "pitch" of holes means the interval of a plurality of holes regularly and repeatedly formed in the Y direction. The plurality of holes 110a on the first column C1 and the third column C3 are arranged so as not to overlap the plurality of holes 110b on the second column C2 in top view. In such a way, the flexible wiring board 110 has the hole forming region A1 in which three columns of hole groups are spaced apart from each other in the X direction.

In the present embodiment, the plurality of holes 110a aligned on the first column C1 are collectively referred to as a first hole group, the plurality of holes 110b aligned on the second column C2 are collectively referred to as a second hole group, and the plurality of holes 110a aligned on the third column C3 are collectively referred to as a third hole group. As illustrated in FIG. 2A, the third hole group is arranged on the opposite side from the first hole group with respect to the second hole group in the X direction in plan view.

Note that the plurality of holes 110b aligned on the second column C2 are holes formed on the cover lay 113 side and therefore depicted by dashed lines in FIG. 2A. Similarly, the plurality of holes 110a aligned on the first column C1 and the third column C3 are holes formed on the flexible base material 111 side and therefore depicted by dashed lines in FIG. 2C.

As illustrated in FIG. 2A, the length in the X direction of the hole 110a is W1. The length in the Y direction of the hole 110a is L1. Further, a region A11 is a region extending in the Y direction adjacent to one hole 110a. In FIG. 2A, the region A11 corresponds to a spacing between one hole 110a and another hole 110a arranged adjacent to each other in the Y direction. The length in the Y direction of the region A11 is G1. The pitch that the plurality of holes 110a are aligned on the first column C1 is D1. The pitch that the plurality of holes 110a are aligned on the third column C3 is the same as D1. In the present embodiment, the length W1 in the X direction of each hole 110a that is a first hole is longer than the length L1 in the Y direction of the hole 110a. That is, the hole 110a is formed as an elongate recess (groove).

On the other hand, the length in the X direction of the hole 110b is W2. The length in the Y direction of the hole 110b is L2. Further, a region A12 is a region extending in the Y direction adjacent to one hole 110b. In FIG. 2A, the region A12 corresponds to a spacing between one hole 110b and another hole 110b arranged adjacent to each other in the Y direction. The length in the Y direction of the region A12 is G2. In the present embodiment, the length G2 of the region A12 is set to be the same as the length G1 of the region A11. The pitch that the plurality of holes 110b are aligned on the second column C2 is D2. In the present embodiment, the pitch D2 of the holes 110b is set to be the same as the pitch D1 of the holes 110a. Further, in the same manner as the holes 110a, the length W2 in the X direction of each hole 110b that is a second hole is longer than the length L2 in the Y direction of the hole 110b.

Further, a line P1 and a line P2 illustrated in FIG. 2A and FIG. 2C represent phases of respective center points of holes in the Y direction. The plurality of holes 110a on the first column C1 and the plurality of holes 110a on the third column C3 are formed so as to have the same phase in the Y direction regarding holes corresponding to each other in the X direction.

In contrast, the plurality of holes 110a on the first column C1 are formed so as to have a phase shifted in the Y direction with respect to the plurality of holes 110b on the second column C2.

As described above, the length, the pitch, and the phase of holes in the hole forming region A1 are determined as appropriate. Accordingly, the region A11 extending in the Y direction adjacent to the holes 110a on the first column C1 is adjacent to the holes 110b on the second column C2 in the X direction. Therefore, at least a part of the hole 110b overlaps the region A11 in side view in the X direction.

Similarly, the region A12 extending in the Y direction adjacent to the holes 110b on the second column C2 is adjacent to the holes 110b on the first column C1 and the third column C3 in the X direction. Therefore, at least a part of the hole 110a overlaps the region A12 in side view in the X direction.

Further, as illustrated in FIG. 2B, the holes 110a in the flexible base material 111 reach the depth of the flexible wiring layer 112. The holes 110a do not penetrate the flexible wiring layer 112 and thus do not reach the cover lay 113. The hole 110a is provided between wiring patterns included in the flexible wiring layer 112.

Further, as illustrated in FIG. 2D, the holes 110b in the cover lay 113 do not penetrate the cover lay 113 and thus do not reach the flexible wiring layer 112.

It is preferable that the holes 110a and the holes 110b be formed such that a part of each hole does not reach at least the flexible wiring layer 112 so that there is no influence such as an increase in the wiring resistance of the flexible wiring layer 112. Note that the hole 110a may be formed as a through hole as long as the wiring resistance of the flexible wiring layer 112 is not affected.

It is preferable to suitably set the processing depth, the pitch, the size, the number, or the like of holes based on a strength of so-called "stiffness" such as hardness or flexibility of the flexible base material 111, the cover lay 113, or the like and on a stress on the connection part 140.

The shape or the depth may differ between each hole 110a and each hole 110b. Further, the shape or the depth of the holes 110a and the holes 110b may differ, respectively, in the hole forming region A1. For example, the shape in top view may be any of a circle, an ellipse, a rectangular, a rhombus, or the like. Further, the sectional shape may be rectangular, corn-shaped, or the like. By changing the arrangement, the number, the depth, the size, the shape, or the like of holes 110a and holes 110b, it is possible to suitably change the flexibility and the strength of the flexible wiring board 110.

If too many holes in the flexible wiring board 110 are formed and thus the so-called "stiffness" is low, the flexible wiring board 110 may slacken and come into contact with an electronic component (not illustrated) on the printed wiring board 121. There is a concern that, when moving, the sensor unit 120 may interfere with an electronic component (not illustrated), a component of the image stabilizer unit 130, or the like and break the flexible wiring board 110 or affect the operation of the imaging module 100. It is thus preferable that the length of the hole forming region in the wiring direction be less than or equal to the length of the flexible wiring board 110 in a direction orthogonal to the wiring direction of the flexible wiring board 110, for example. The number of columns is 10 or less and more preferably 5 or less.

Further, if the number of columns is one, the effect of making the flexible wiring board 110 flexible is reduced against rotation in the θ direction. Thus, the number of columns is required to be at least two or greater and is more preferably three or greater.

When the holes are formed such that the phases of the holes 110a and the holes 110b are the same or when the hole lengths in the wiring direction of the holes 110a and the holes 110b are longer, the flexible wiring board 110 will have low "stiffness" only in one direction thereof and be easily deformed during handling when the flexible wiring board 110 is installed to the printed wiring board 121 or the like. This increases a concern that the flexible wiring board 110 interferes with a mechanical component (not illustrated), an electronic component (not illustrated), or the like and breaks. Therefore, rather than the arrangement in which the holes 110a and the holes 110b are formed with the same phase, checkerboard-patterned arrangement in which holes are formed with shifted phases is not only superior in the flexibility of the flexible wiring board 110 with respect to rotation of the θ direction but also more advantageous in terms of easy handling of the flexible wiring board 110.

In such a way, the imaging module 100 according to the present embodiment is configured.

In recent years, an image stabilizer unit that moves an imaging sensor used for image stabilization is mounted inside digital cameras. In the image stabilizer unit, not only a static stress as has been the case but also a dynamic stress during image stabilization, such as vibration, is superimposed thereon in the XY plane direction and the θ rotation direction, for example. Thus, a flexible wiring board connecting a rigid wiring board mounting an imaging sensor thereon to a rigid wiring board mounting image processing LSI thereon is required to have flexibility that does not interfere with driving of the image stabilizer unit and a joining strength against repeated stresses.

On the other hand, the flexible wiring board 110 according to the present embodiment has the plurality of holes 110a and the plurality of holes 110b in the intermediate part in the X direction (first direction) from the first terminal unit, which includes a plurality of connection terminals (first electrodes 115) provided to one end of the flexible wiring layer 112, to the second terminal unit, which includes the plurality of second connection terminals 116 provided to the other end. The plurality of holes 110a and the plurality of holes 110b are spaced apart from each other in the X direction (first direction). The insulator region adjacent to the holes 110a in the Y direction (second direction) intersecting the X direction is adjacent to at least a part of the hole 110b in the X direction. Similarly, the insulator region adjacent to the holes 110b in the Y direction is adjacent to at least a part of the hole 110a in the X direction. Note that the region adjacent to holes may include not only an insulator region formed of the insulator of the flexible wiring board 110 but also a conductor region formed of the conductor of the flexible wiring layer 112.

In such a way, in the flexible wiring board 110 according to the present embodiment, since two or more columns of hole groups (recess groups) are formed in a region near the connection part 140 at a predetermined pitch in the Y direction intersecting the X direction from the first terminal unit to the second terminal unit provided to the flexible wiring layer 112, the region near the connection part 140 is locally made flexible. That is, since the configuration is not to reinforce the entire flexible wiring board 110, the flexibility of the flexible wiring board 110 is not impaired. Thus, even when the sensor unit 120 to be connected moves in multiple directions, the flexible wiring board 110 can be deformed in accordance with a motion direction.

Thus, the region near the connection part 140 between the flexible wiring board 110 and the printed wiring board 121 can be locally made flexible. As a result, deformation in the region near the connection part 140 of the flexible wiring board 110 due to driving of the image stabilizer unit 130 is facilitated, and the stress applied to the connection part 140 can be reduced. Furthermore, since the bending angle of the flexible wiring board 110 during driving can be an obtuse angle, the stress on the connection part 140 can be reduced, and the reliability of the connection part 140 between the flexible wiring board 110 and the printed wiring board 121 can be improved.

Further, according to the present embodiment, it is possible to achieve both high strength and high flexibility (plasticity) of the flexible wiring board 110. That is, it is possible to improve the reliability of the connection at the connection part 140 while reducing the stress occurring at the connection part 140 between the flexible wiring board 110 and the printed wiring board 121. Further, since holes are formed in the flexible wiring board 110 at a predetermined pitch and a predetermined phase, the strength of the flexible wiring board 110 can be suitably adjusted. Accordingly, since the flexible wiring board 110 is moderately deformed during motion of the sensor unit 120, the operation of the image stabilizer unit 130 is not interfered.

Note that, in the present embodiment, the number of flexible wiring boards 110 may be two or greater without being limited to one. Furthermore, the connection position between the flexible wiring board 110 and the printed wiring board 121 is not limited to the center of the printed wiring board 121 and may be the end of the printed wiring board 121. Further, when a plurality of flexible wiring boards 110 are mounted on the imaging module 100, the position of one of the plurality of flexible wiring boards 110 may be the center of the printed wiring board 121, and the position of another may be the end of the printed wiring board 121, for example.

Further, in the present embodiment, the imaging module 100 has been illustrated as a module as an example. However, the module may include no imaging sensor device. Further, the module is not limited to an electronic module. That is, the module may be a module on which no electronic component is mounted. An electronic module can be formed by mounting an electronic component on a module having no mounted electronic component.

Further, although the case where the X direction from the first terminal unit to the second terminal unit and the Y direction in which the connection terminals and the holes are aligned are orthogonal to each other has been illustrated as an example in the present embodiment, the two directions are not necessarily required to be orthogonal to each other and are required to intersect each other.

Furthermore, in the present embodiment, a case where the pitch and the phase of the third hole group including the plurality of holes 110a aligned on the third column C3 are the same as the pitch and the phase in the first hole group including the plurality of holes 110a aligned on the first column C1 has been described. However, the positional relationship between a plurality of holes in the third hole group and a plurality of holes in the first hole group is not limited thereto. In the flexible wiring board 110, it is preferable to satisfy at least one of (A) that the pitch in the third hole group is the same as the pitch in the first hole group are the same and (B) that the alignment of a plurality of holes in the first hole group and the alignment of a plurality of holes in the third hole group have the same phase in the Y direction.

Second Embodiment

Next, the imaging module 100 according to a second embodiment will be described with reference to FIG. 5, FIG. 6A to FIG. 6D, FIG. 7, and FIG. 8.

Figure 5:
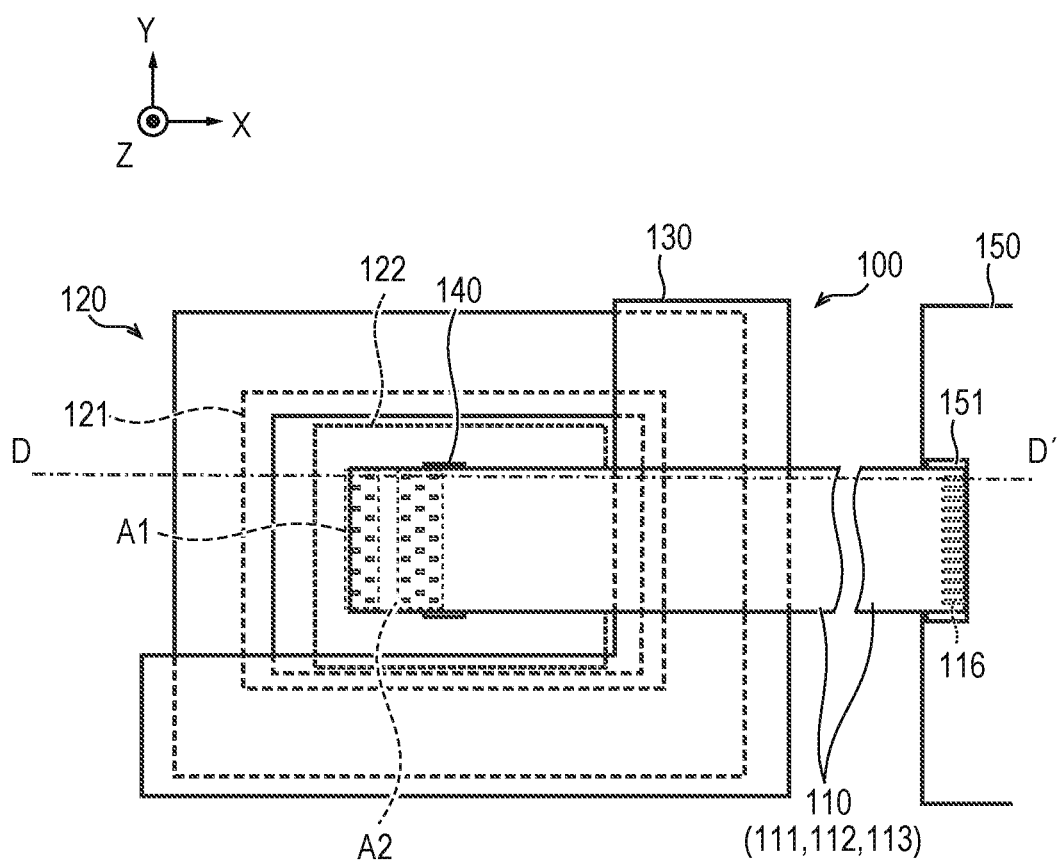
FIG. 5 is a top view illustrating a general configuration of an imaging module according to a second embodiment.
Figure 6A:
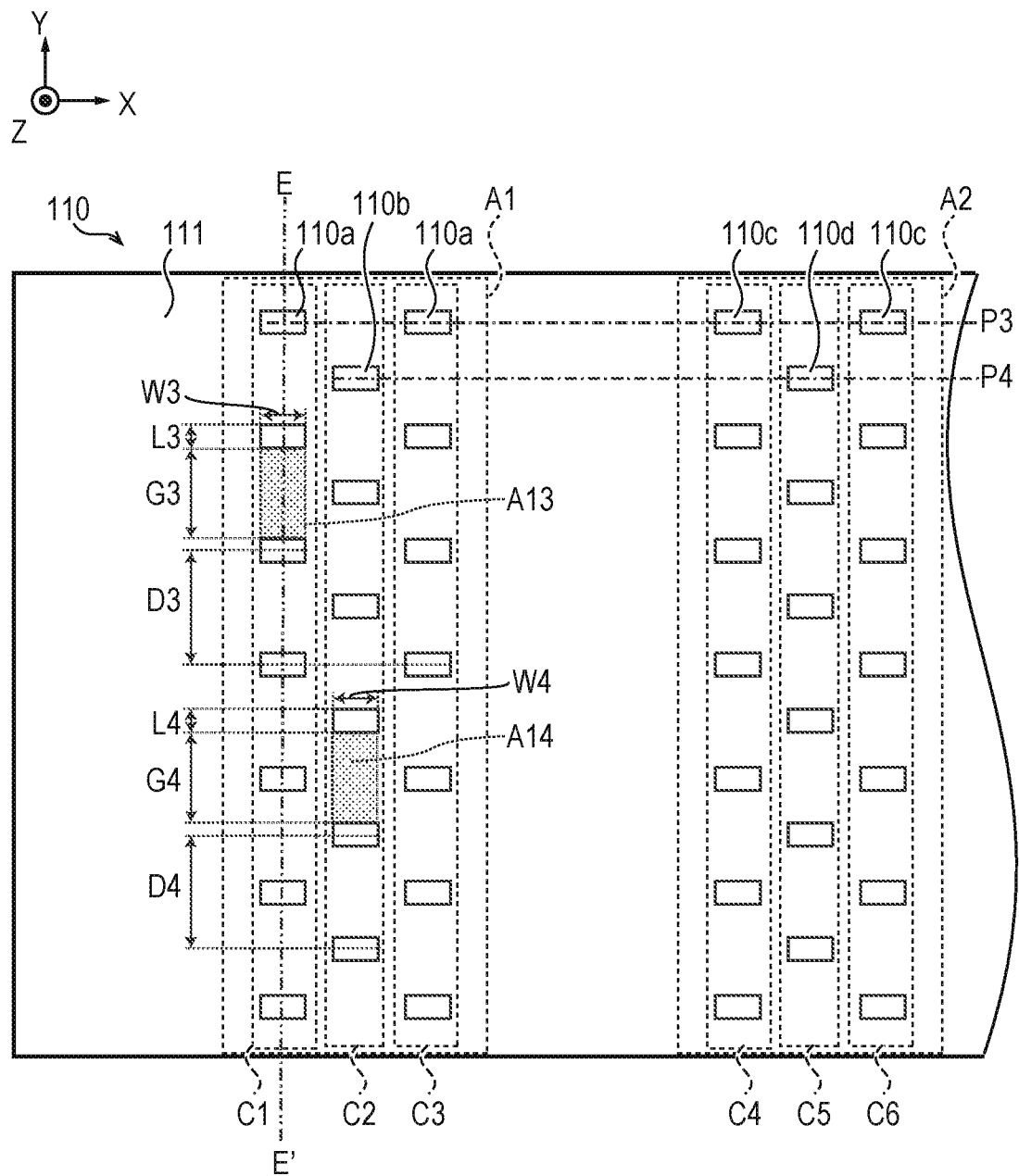
FIG. 6A is a top view of hole forming regions of a flexible wiring board before mounted on the imaging module according to the second embodiment.
Figure 6B:
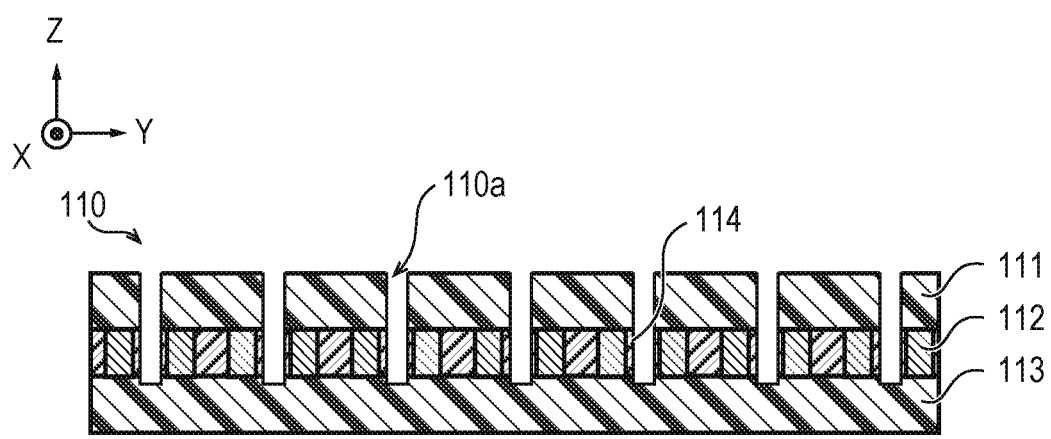
FIG. 6B is a sectional view taken along a line E-E' illustrated in FIG. 6A.
Figure 6D:
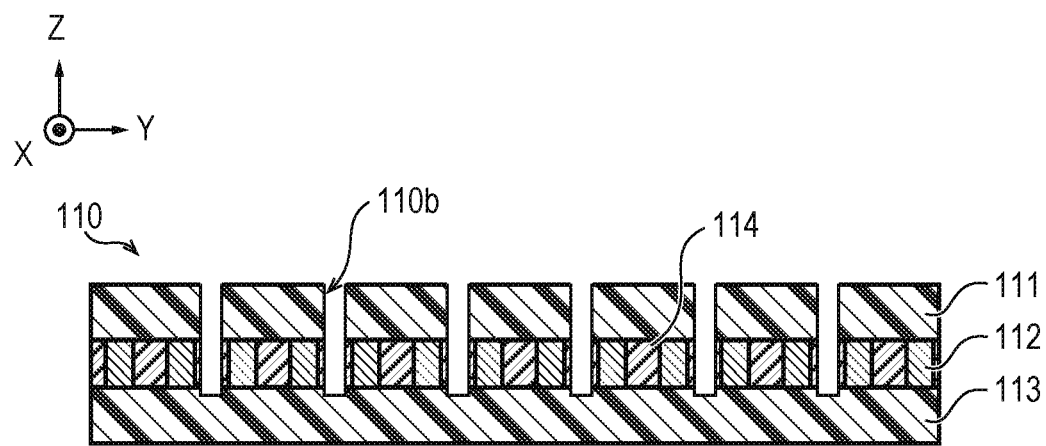
FIG. 6D is a sectional view taken along a line F-F' illustrated in FIG. 6C.
Figure 7:
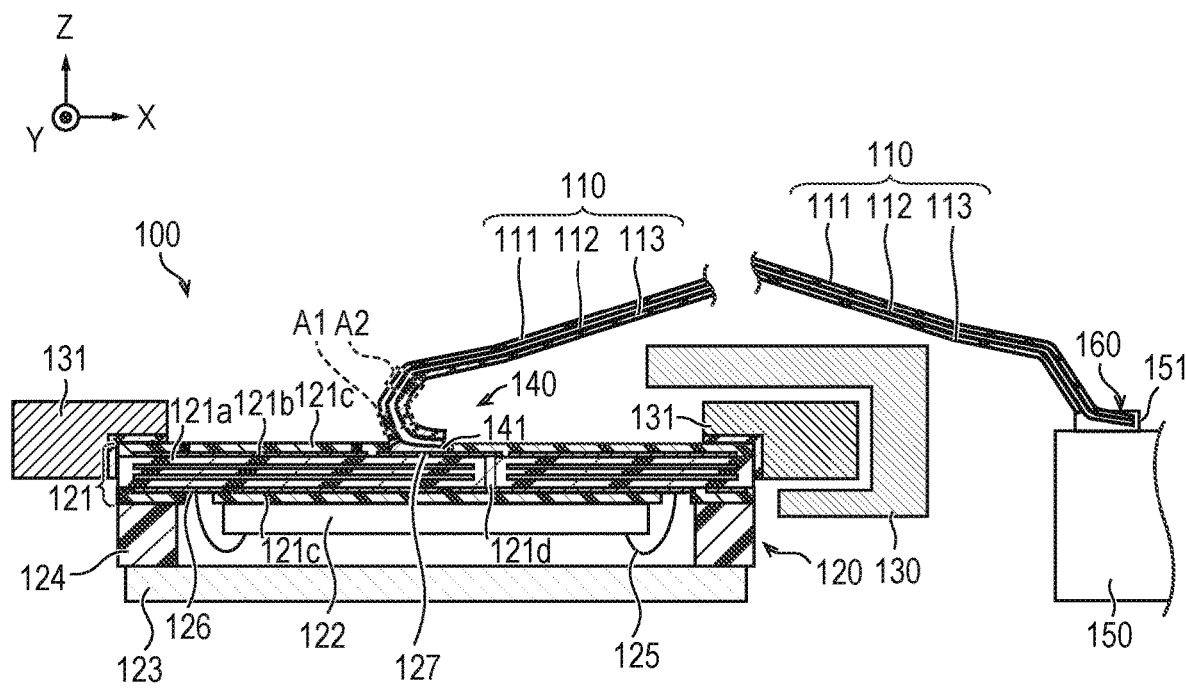
FIG. 7 is a sectional view taken along a line D-D' illustrated in FIG. 5.

FIG. 5 is a top view illustrating the general configuration of the imaging module 100 according to the present embodiment. FIG. 6A is a top view of the hole forming regions A1 and A2 of the flexible wiring board 110 before mounted on the imaging module 100 according to the present embodiment. FIG. 6B is a sectional view taken along the line E-E' illustrated in FIG. 6A. FIG. 6C is an underside view of the hole forming regions A1 and A2 of the flexible wiring board 110 before mounted on the imaging module 100. FIG. 6D is a sectional view taken along the line F-F' illustrated in FIG. 6C. FIG. 7 is a sectional view taken along the line D-D' illustrated in FIG. 5. FIG. 8 is an enlarged sectional view of a main part of the imaging module 100 illustrated in FIG. 7.

The present embodiment differs from the first embodiment in an arrangement scheme of the flexible wiring board 110. Specifically, in the flexible wiring board 110 in the present embodiment, as illustrated in FIG. 5 and FIG. 7, one end edge is connected at the connection part 140, and the other end edge is then bent by being folded back once toward the connecting target. Further, the hole forming regions A1 and A2 are arranged in a bending portion of the flexible wiring board 110 to improve the flexibility of the flexible wiring board 110 in the hole forming regions A1 and A2. The holes 110a and 110b in the hole forming region A1 and holes 110c and 110d in the hole forming region A2 are formed in the flexible wiring board 110 by a laser processing machine before the flexible wiring board 110 is connected to the printed wiring board 121.

In FIG. 6A and FIG. 6C, respective regions of the hole forming regions A1 and A2 in which a plurality of holes are aligned, the first column C1, the second column C2, and the third column C3 in the hole forming region A1, and the fourth column C4, the fifth column C5, and the sixth column C6 in the hole forming region A2 are illustrated by dashed line over the flexible base material 111 of the flexible wiring board 110. Note that all the holes in the hole forming regions A1 and A2 are holes formed on the flexible base material 111 side in the present embodiment and thus are illustrated by dashed lines in FIG. 6C.

The plurality of holes 110a are aligned at a predetermined pitch and a predetermined phase on the first column C1 and the third column C3 in the hole forming region A1. Further, the plurality of holes 110b are aligned at a predetermined pitch and a predetermined phase on the second column C2 in the hole forming region A1.

On the other hand, the plurality of holes 110c are aligned at a predetermined pitch and a predetermined phase on the fourth column C4 and the sixth column C6 in the hole forming region A2. The plurality of holes 110d are aligned at a predetermined pitch and a predetermined phase on the fifth column C5 in the hole forming region A2. The positional relationship between the plurality of holes 110c and the plurality of holes 110d in the hole forming region A2 is the same as the positional relationship between the plurality of holes 110a and the plurality of holes 110b in the hole forming region A1. The number, the length, the pitch, and the phase of holes are also the same. Thus, the hole forming region A1 will be described below as an example.

As illustrated in FIG. 6A, the length in the X direction of the holes 110a on the first column C1 is W3. The length in the Y direction of the holes 110a on the first column C1 is L3. Further, a region A13 is a region extending in the Y direction adjacent to one hole 110a. In FIG. 6A, the region A13 corresponds to a spacing between one hole 110a and another hole 110a arranged adjacent to each other in the Y direction. The length in the Y direction of the region A13 is G3. The pitch that the plurality of holes 110a are aligned on the first column C1 is D3. Note that the pitch and the phase of the holes 110a on the first column C1 are the same as the pitch and the phase of the holes 110a on the third column C3 in the Y direction.

On the other hand, the length in the X direction of the holes 110b on the second column C2 is W4. The length of the hole 110b in the Y direction is L4. Further, a region A14 is a region extending in the Y direction adjacent to one hole 110b. In FIG. 6A, the region A14 corresponds to a spacing between one hole 110b and another hole 110b arranged adjacent to each other in the Y direction. The length in the Y direction of the region A14 is G4. In the present embodiment, the length G4 of the region A14 is set to be the same as the length G3 in the region A13. On the second column C2, the pitch that the plurality of holes 110b are aligned is D4. The pitch D4 of the holes 110b is set to be the same as the pitch D3 of the holes 110a.

Further, a line P3 and a line P4 illustrated in FIG. 6A and FIG. 6C represent phases of respective center points of holes in the Y direction. The plurality of holes 110a on the first column C1 and the third column C3 and the plurality of holes 110c on the fourth column C4 and the sixth column C6 are formed so as to have the same phase in the Y direction regarding holes corresponding to each other in the X direction. Further, the plurality of holes 110b on the second column C2 and the plurality of holes 110d on the fifth column C5 are formed so as to have the same phase in the Y direction regarding holes corresponding to each other in the X direction. Further, the plurality of holes 110b on the second column C2 and the plurality of holes 110d on the fifth column C5 are formed so that the phases thereof are shifted in the Y direction with respect to the plurality of holes 110a on the first column C1 and the plurality of holes 110c on the fourth column C4.

As described above, the length, the pitch, and the phase of the holes in the hole forming regions A1 and A2 are suitably determined. Accordingly, the region A13 extending in the Y direction adjacent to the holes 110a on the first column C1 is adjacent to the holes 110b on the second column C2 in the X direction. Therefore, at least a part of the hole 110b overlaps the region A13 in side view in the X direction.

Similarly, the region A14 extending in the Y direction adjacent to the holes 110b on the second column C2 is adjacent to the holes 110a on the first column C1 and the third column C3 in the X direction. Therefore, at least a part of the hole 110a overlaps the region A14 in side view in the X direction.

Further, it is preferable that the holes 110a, the holes 110b, the holes 110c, and the holes 110d arranged at predetermined pitches and predetermined phases in the Y direction as described above be formed such that a part of each hole does not reach at least the flexible wiring layer 112 so that there is no influence such as an increase in the wiring resistance of the flexible wiring layer 112.

As illustrated in FIG. 6B and FIG. 6D, the holes 110a and the holes 110b inside the hole forming region A1 and the holes 110*c* and the holes 110*d* inside the hole forming region A2 of the flexible wiring board 110 are formed from the side in the Z direction of the flexible base material 111. As illustrated in FIG. 6B, although the holes 110*a*, the holes 110*b*, the holes 110*c*, and the holes 110*d* in the flexible base material 111 do not penetrate the cover lay 113, each hole is formed so as to reach the inside of the cover lay 113. That is, the insulator forming the flexible wiring board 110 of the present embodiment includes a first insulator layer (flexible base material 111) and a second insulator layer (cover lay 113), and the flexible wiring layer 112 is provided between the first insulator layer and the second insulator layer. Further, the first holes (holes 110*a*, holes 110*c*) and the second holes (holes 110*b*, holes 110*d*) each are a bottomed hole that penetrates the first insulator layer (flexible base material 111) and whose bottom is formed of the second insulator layer (cover lay 113).

Note that the holes 110*a*, the holes 110*b*, the holes 110*c*, and the holes 110*d* may be formed so as to penetrate the cover lay 113 as long as the wiring resistance of the flexible wiring layer 112 is not affected. Specifically, the insulator forming the flexible wiring board 110 includes the first insulator layer (flexible base material 111) and the second insulator layer (cover lay 113), and the flexible wiring layer 112 is provided between the first insulator layer and the second insulator layer. Further, the first holes (holes 110*a*, holes 110*c*) and the second holes (holes 110*b*, holes 110*d*) each are a through hole that penetrates the first insulator layer (flexible base material 111) and the second insulator layer (cover lay 113). However, when the through hole interferes with a chip component (not illustrated) or the like mounted on the printed wiring board 121, the flexible wiring board 110 may tear and break. In such a case, it is preferable that there be no such penetration.

It is preferable to suitably set the processing depth, the pitch, the size, the number, or the like of holes based on a strength of so-called "stiffness" such as hardness or flexibility of the flexible base material 111, the cover lay 113, or the like and on a stress on the connection part 140.

The shape or the depth may differ between the holes inside the hole forming region A1 (holes 110*a*, holes 110*b*) and the hole inside the hole forming region A2 (holes 110*c*, holes 110*d*). Further, the shapes or the depths of the holes 110*a* and the holes 110*b* may differ, respectively, in the hole forming region A1. Similarly, the shapes or the depths of the holes 110*c* and the holes 110*d* may differ, respectively, in the hole forming region A2. For example, the shape in top view may be any of a circle, an ellipse, a rectangular, a rhombus, or the like. Further, the sectional shape may be rectangular, corn-shaped, or the like.

The present embodiment differs from the first embodiment in the form of arrangement of the flexible wiring board 110 relative to the printed wiring board 121. Note that, since other features are the same as those in the first embodiment, the description for the same features will be omitted.

In the first embodiment, the flexible wiring board 110 is arranged to the connection part 140 so as to, without being bent, extend outward in the +X direction on the side of the image processing unit 150 that is a connecting target to which the other end edge opposite to one end edge on the connection part 140 side is connected.

In contrast, the flexible wiring board 110 in the present embodiment is arranged to the connection part 140 so as to extend outward in the −X direction opposite to the +X direction on the side of the image processing unit 150 that is a connecting target to which the other end edge is connected. Furthermore, the flexible wiring board 110 extending outward in the −X direction is bent in the +X direction on the image processing unit 150 side on the printed wiring board 121.

That is, in the present embodiment, as illustrated in FIG. 5, FIG. 6A to FIG. 6D, FIG. 7, and FIG. 8, the first electrodes 115 are connected to the second electrodes 127 by the solder 141 so that the one end edge faces the +X direction that is opposite to the case of the first embodiment, and thereby the flexible wiring board 110 is connected to the printed wiring board 121. Furthermore, the flexible wiring board 110 is once folded back to the image stabilizer unit 130 side from the opposite side to the image stabilizer unit 130 into a bent state so that the other end edge is located on the side of the image stabilizer unit 130 and the image processing unit 150 that is the connecting target thereof.

In such a way, in the present embodiment, even with the bent flexible wiring board 110, it is possible to reduce a stress occurring at the connection part 140 between the flexible wiring board 110 and the printed wiring board 121 without interfering with driving of the image stabilizer unit 130 and improve the reliability of connection at the connection part 140 in the same manner as in the first embodiment.

Note that, in the present embodiment, the number of flexible wiring boards 110 may be two or greater without being limited to one. Furthermore, the connection position between the flexible wiring board 110 and the printed wiring board 121 is not limited to the center of the printed wiring board 121 and may be the end of the printed wiring board 121. Further, when a plurality of flexible wiring boards 110 are mounted, the positional relationship thereof may be such that the position of one of the plurality of flexible wiring boards 110 may be the center of the printed wiring board 121 and the position of another may be the end of the printed wiring board 121.

Further, a shield material or the like against radio waves, magnetism, or the like may be formed by coating or the like on either the flexible base material 111 or the cover lay 113. In such a case, it is possible to form the holes in the same manner as in the first embodiment from the front surface side on which no shield material is formed so as not to process the shield material or the flexible wiring layer 112.

Further, in FIG. 6B and FIG. 6D, the structure of the bottomed hole when the insulator forming the flexible wiring board 110 includes the flexible base material 111 as the first insulator layer and the cover lay 113 as the second insulator layer has been described. However, the structure of the bottomed hole is not limited thereto. Specifically, the bottomed hole may be formed from the cover lay 113 side rather than formed from the flexible base material 111 side. That is, the insulator forming the flexible wiring board 110 may include the cover lay 113 as the first insulator layer and the flexible base material 111 as the second insulator layer, and the flexible wiring layer 112 may be provided between the first insulator layer and the second insulator layer. In such a case, the first holes (holes 110*a*, holes 110*c*) and the second holes (holes 110*b*, holes 110*d*) may each be a bottomed hole that penetrates the cover lay 113 (first insulator layer) and whose bottom is formed of the flexible base material 111 (second insulator layer).

Furthermore, also in the present embodiment, the number of flexible wiring boards 110 may be two or greater. The connection position between the flexible wiring board 110 and the printed wiring board 121 is not limited to the center of the printed wiring board 121 and may be the end of the printed wiring board 121.

Third Embodiment

Figure 9:
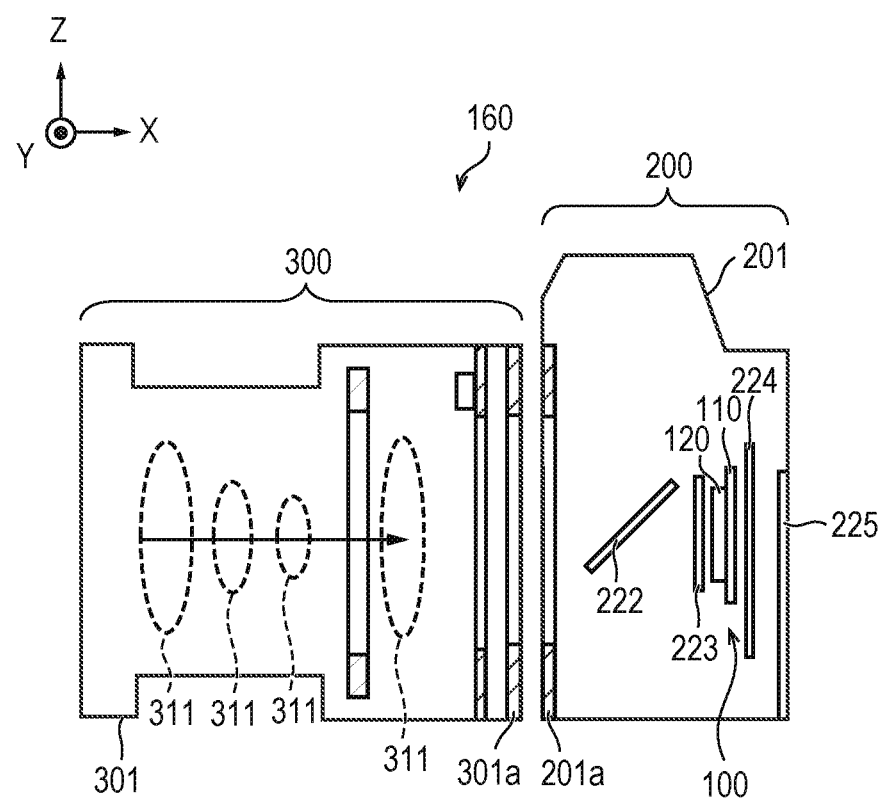
FIG. 9 is a diagram illustrating a general configuration of an imaging apparatus as an example of an electronic device according to a third embodiment.

FIG. 9 is a diagram illustrating a camera 160 that is an imaging apparatus as an example of the electronic device having the imaging module 100 according to the first embodiment or the second embodiment described above.

The imaging module 100 has the configuration described in the first embodiment or the second embodiment described above and includes the image stabilizer unit 130, the sensor unit 120 including the printed wiring board 121, and the flexible wiring board 110.

As illustrated in FIG. 9, the camera 160 includes a camera body 200 and an interchangeable lens 300 (lens barrel) detachable from the camera body 200. In FIG. 9, the interchangeable lens 300 has been attached to the camera body 200. A case where the interchangeable lens 300 is attached to the camera body 200 to form the camera 160 that is an imaging apparatus will be described below.

The camera body 200 has a casing 201 and includes a mirror 222, a shutter 223, the imaging module 100 that is a printed circuit board, and an image processing circuit 224 that are contained in the casing 201. The imaging module 100 and the image processing circuit 224 are electrically connected to each other by a cable (not illustrated) in a communicable manner. Further, the camera body 200 has a liquid crystal display 225 fixed to the casing 201 so as to be exposed out of the casing 201.

The interchangeable lens 300 has the casing 201, which is an interchangeable lens casing, and an imaging optical system. The imaging optical system is arranged inside the casing 301 and captures an optical image on the sensor unit 120 when the casing 301 (interchangeable lens 300) is attached to the casing 201. The imaging optical system is formed of a plurality of lenses.

The casing 301 of the interchangeable lens 300 has a lens-side mount 301a with an opening formed. On the other hand, the casing 201 of the camera body 200 has a camera-side mount 201a with an opening formed. When the lens-side mount and the camera-side mount are fit to each other, the interchangeable lens 300 (casing 301) is attached to the camera body 200. Note that the X direction arrow illustrated in FIG. 9 indicates the optical axis direction of the imaging optical system.

The light traveling in the X direction is guided into the casing 201 through the opening of the lens-side mount 301a of the casing 301 and the opening of the camera-side mount 201a of the casing 201 by the imaging optical system. The mirror 222, the shutter 223, and the like are provided in front in the X direction of the imaging module 100 in the X direction inside the casing 201.

The imaging sensor device 122 in the sensor unit 120 is a solid state imaging device such as a CMOS image sensor or a CCD image sensor that photoelectrically converts an optical image captured by the imaging optical system.

The imaging apparatus on which the imaging module 100 according to the present embodiment of the above configuration is mounted can reduce a stress occurring at the connection part 140 between the flexible wiring board 110 and the printed wiring board 121 without interfering with driving of the image stabilizer unit 130 and sufficiently ensure the reliability of connection at the connection part 140 and the optical performance of a built-in CMOS image sensor.

Further, although the case where the camera 160 has the camera body 200 and the interchangeable lens 300 in a separate manner has been described in the present embodiment, the camera 160 may be an integral type in which the lens is built in the camera body 200.

Further, although the camera 160 has been described as the imaging apparatus that is an electronic device in the present embodiment, the embodiment is not limited thereto.

Further, although the case where the electronic component is an image sensor or a memory device has been described as an example in the present embodiment, the embodiment is not limited thereto. For example, the electronic component may be a semiconductor device used for image processing or a power supply IC.

Furthermore, although the case where the electronic device is a digital camera has been described as an example in the present embodiment, the embodiment is not limited thereto. For example, the electronic device may be an information device such as a smartphone or a personal computer or a communication device such as a modem or a router. Alternatively, the electronic device may be a business machine such as a printer or a copying machine, a medical instrument such as an X-ray image capture device or an endoscope, an industrial machine such as a robot or a semiconductor manufacturing apparatus, or a transportation apparatus such as a vehicle, an aircraft, or a ship. Given that wirings are provided in a limited space inside a casing of an electronic device, the use of the flexible wiring board 110 can reduce the size or increase the density of the electronic device due to the flexibility thereof. Among other things, when the electronic device has a movable part, the use of the flexible wiring board 110 in the movable part can improve the reliability of the electronic device due to the high strength thereof.

Modified Embodiments

Next, hole forming patterns on the flexible wiring board 110 in modified embodiments will be described with reference to FIG. 10 to FIG. 15. FIG. 10 to FIG. 15 are top views each illustrating the general configuration of the flexible wiring board 110 according to a modified embodiment.

Figure 10:
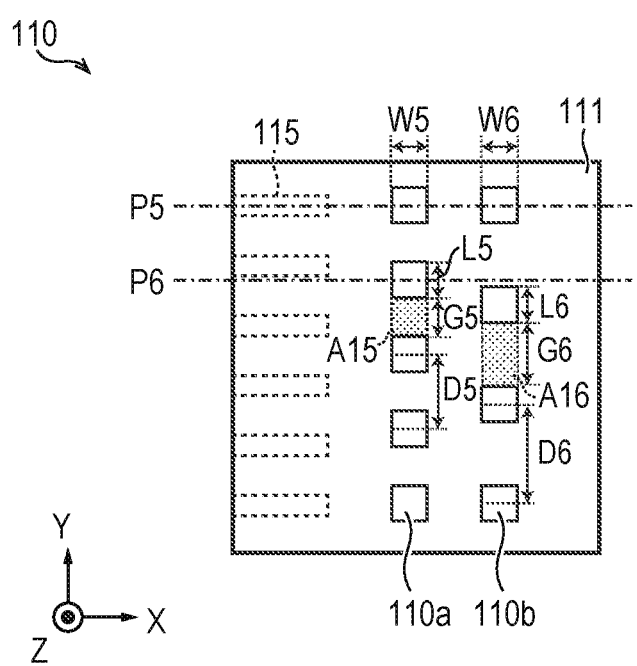
FIG. 10 is a top view illustrating a general configuration of a flexible wiring board according to a modified embodiment.

In a case of FIG. 10, five holes 110a and four holes 110b are provided on the flexible base material 111 side. The length in the X direction of the hole 110a is W5. The length in the Y direction of the hole 110a is L5. The region A15 is a region corresponding to a spacing between two holes 110a adjacent in the Y direction, which is a first insulator region in the flexible base material 111. The length in the Y direction of the region A15 is G5. The pitch in the Y direction of the first hole group formed of the plurality of holes 110a is D5.

On the other hand, the length in the X direction of the hole 110b is W6. The length in the Y direction of the hole 110b is L6. The region A16 is a region corresponding to a spacing between two holes 110b adjacent in the Y direction, which is a second insulator region in the flexible base material 111. The length in the Y direction of the region A16 is G6. The length G6 in the Y direction of the region A16 is longer than the length L6 in the Y direction of the hole 110b (second hole). The pitch in the Y direction of the second hole group formed of the plurality of holes 110b is D6.

The lengths W6 and L6 of the hole 110b are the same as the lengths W5 and L5 of the hole 110a, respectively.

The pitch D5 of the first hole group differs from the pitch D6 of the second hole group. In the Y direction, the length G5 of the region A15 is shorter than the length G6 of the region A16.

Further, the line P5 and the line P6 illustrate the phases of the center points of two holes 110a adjacent in the Y direction.

In the relationship between the first hole group and the second hole group in FIG. 10, the phase in the Y direction is the same for holes at both ends but differs between holes located in the intermediate part. That is, the alignment of a plurality of holes 110a in the first hole group and the alignment of a plurality of holes 110b in the second hole group have different phases in the Y direction.

Also in the case of FIG. 10, at least a part of the region A15 in the first hole group is adjacent to the hole 110b in the X direction in the same manner as in the first embodiment. Similarly, at least a part of the region A16 in the second hole group is adjacent to the hole 110a in the X direction. Therefore, the pitch D5 of the first hole group may differ from the pitch D6 of the second hole group. Further, the number of holes 110a may differ from the number of holes 110b.

Figure 11:
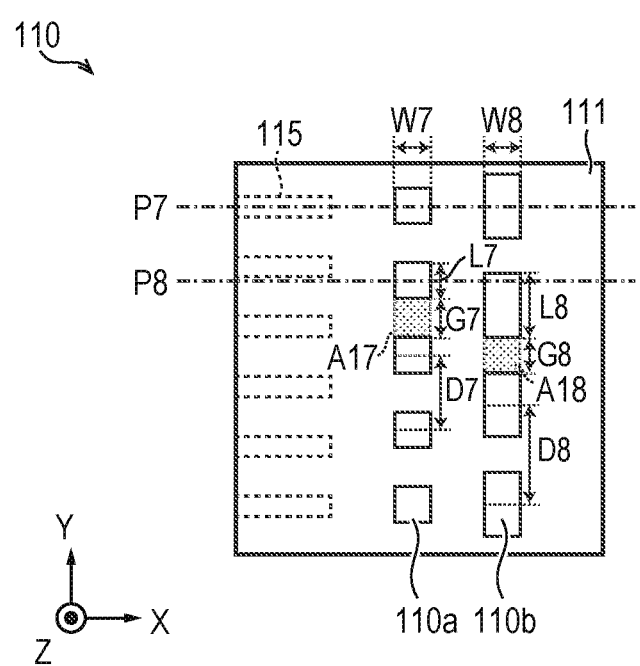
FIG. 11 is a top view illustrating a general configuration of a flexible wiring board according to a modified embodiment.

In the case of FIG. 11, five holes 110a and four holes 110b are provided on the flexible base material 111 side. The length in the X direction of the hole 110a is W7. The length in the Y direction of the hole 110a is L7. The region A17 is a region corresponding to a spacing between two holes 110a adjacent in the Y direction, which is the first insulator region in the flexible base material 111. The length in the Y direction of the region A17 is G7. The pitch in the Y direction of the first hole group formed of the plurality of holes 110a is D7.

On the other hand, the length in the X direction of the hole 110b is W8. The length in the Y direction of the hole 110b is L8. The region A18 is a region corresponding to a spacing between two holes 110b adjacent in the Y direction, which is the second insulator region in the flexible base material 111. The length in the Y direction of the region A18 is G8. The pitch in the Y direction of the second hole group formed of the plurality of holes 110b is D8.

The length W8 of the hole 110b is the same as the length W7 of the hole 110a. However, the length L8 of the hole 110b is longer than the length L7 of the hole 110a. Further, the pitch D7 of the first hole group differs from the pitch D8 of the second hole group. The length G7 of the region A17 is longer than the length G8 of the region A18 in the Y direction.

Further, the line P7 and the line P8 illustrate the phases of the center points of two holes 110a adjacent in the Y direction.

In the relationship between the first hole group and the second hole group in FIG. 11, the phase in the Y direction is the same for holes at both ends but differs between holes located in the intermediate part.

Also in the case of FIG. 11, at least a part of the region A17 in the first hole group is adjacent to the hole 110b in the X direction in the same manner as in the first embodiment. Similarly, at least a part of the region A18 in the second hole group is adjacent to the hole 110a in the X direction. Therefore, the length L7 of the hole 110a may differ from the length L8 of the hole 110b in the Y direction. The pitch D7 of the first hole group may differ from the pitch D8 of the second hole group.

Figure 12:
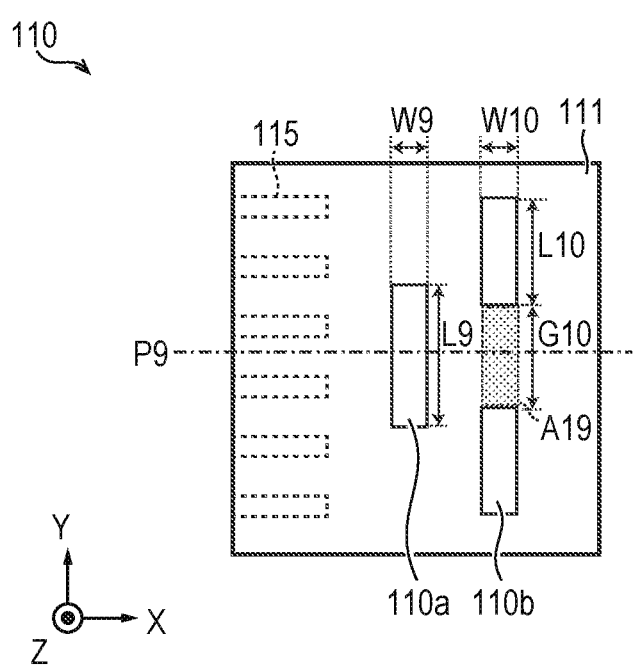
FIG. 12 is a top view illustrating a general configuration of a flexible wiring board according to a modified embodiment.

In the case of FIG. 12, one hole 110a and two holes 110b are provided on the flexible base material 111 side. The length in the X direction of the hole 110a is W9. The length in the Y direction of the hole 110a is L9.

On the other hand, the length in the X direction of the hole 110b is W10. The length in the Y direction of the hole 110b is L10. The region A19 is a region corresponding to a spacing between two holes 110b adjacent in the Y direction, which is the insulator region in the flexible base material 111. The length in the Y direction of the region A19 is G10. The length W10 of the hole 110b is the same as the length W9 of the hole 110a. The length L10 of the hole 110b is shorter than the length L9 of the hole 110a.

The line P9 illustrates the phase of the center point of the hole 110a in the Y direction. The phase of the hole 110a in the Y direction in FIG. 12 differs from the phase of two holes 110b. Further, the length L9 of the hole 110a is longer than the length G10 of the region A19 in the Y direction. Also in the case of FIG. 12, at least a part of a region extending in the Y direction adjacent to the hole 110a is adjacent to the hole 110b in the X direction in the same manner as in the first embodiment. Therefore, the number of holes 110a may differ from the number of holes 110b.

Figure 13:
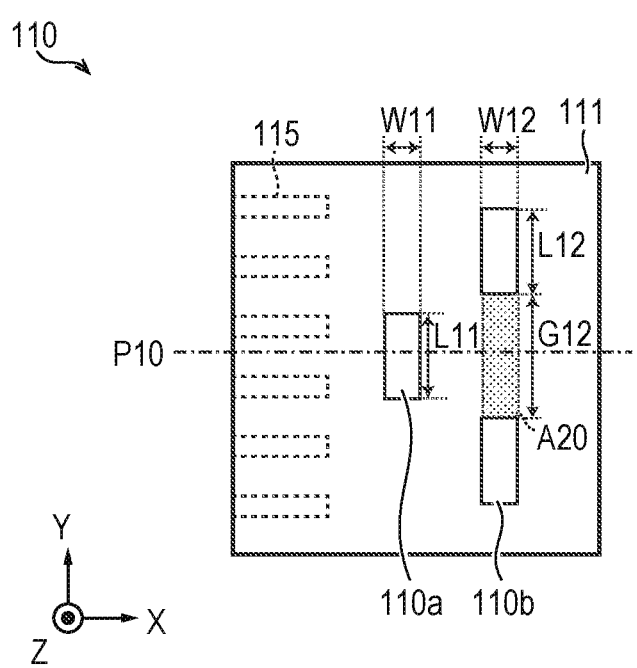
FIG. 13 is a top view illustrating a general configuration of a flexible wiring board according to a modified embodiment.

In the case of FIG. 13, one hole 110a and two holes 110b are provided on the flexible base material 111 side in the same manner as in FIG. 12. The length in the X direction of the hole 110a is W11. The length in the Y direction of the hole 110a is L11.

On the other hand, the length in the X direction of the hole 110b is W12. The length in the Y direction of the hole 110b is L12. The region A20 is a region corresponding to a spacing between two holes 110b adjacent in the Y direction, which is the insulator region in the flexible base material 111. The length in the Y direction of the region A20 is G12. The length W12 of the hole 110b is the same as the length W11 of the hole 110a. The length L12 of the hole 110b is longer than the length L11 of the hole 110a.

The line P10 illustrates the phase of the center point of the hole 110a in the Y direction. The phase of the hole 110a in the Y direction in FIG. 13 differs from the phase of two holes 110b. Further, the length L11 of the hole 110a is shorter than the length G12 of the region A19 in the Y direction. Also in the case of FIG. 13, at least a part of a region extending in the Y direction adjacent to the hole 110a is adjacent to the hole 110b in the X direction in the same manner as in the first embodiment. Similarly, the region A20 is adjacent to the hole 110a in the X direction. Therefore, the number of holes 110a may differ from the number of holes 110b. The length L11 of the hole 110a may differ from the length L12 of the hole 110b in the Y direction.

Figure 14:
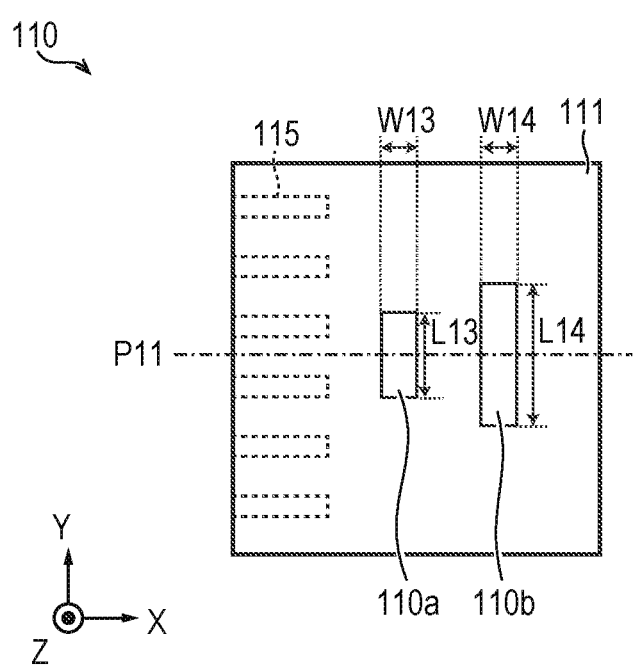
FIG. 14 is a top view illustrating a general configuration of a flexible wiring board according to a modified embodiment.

In the case of FIG. 14, one hole 110a and one hole 110b are spaced apart from each other in the X direction on the flexible base material 111 side. The length in the X direction of the hole 110a is W13. The length in the Y direction of the hole 110a is L13.

On the other hand, the length in the X direction of the hole 110b is W14. The length in the Y direction of the hole 110b is L14. The length L14 of the hole 110b is longer than the length L13 of the hole 110a.

The line P11 illustrates the phase of the center point of the hole 110a in the Y direction. The phase of the hole 110a in the Y direction is the same as the phase of the hole 110b. In the Y direction, however, the length L13 of the hole 110a is shorter than the length L14 of the hole 110b. Thus, also in the case of FIG. 14, at least a part of a region extending in the Y direction adjacent to the hole 110a is adjacent to the hole 110b in the X direction in the same manner as in the first embodiment. Therefore, the number of holes 110a and the number of holes 110b are not necessarily limited to plural and may be singular.

Figure 15:
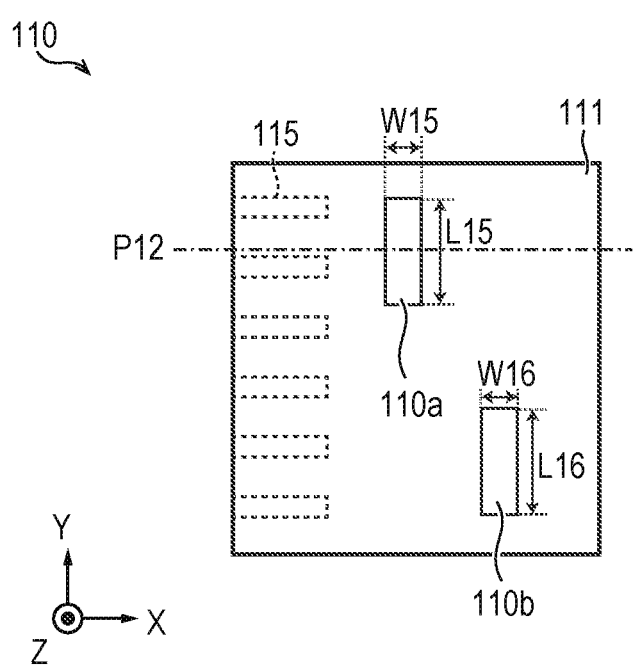
FIG. 15 is a top view illustrating a general configuration of a flexible wiring board according to a modified embodiment.

In the case of FIG. 15, one hole 110a and one hole 110b are spaced apart from each other in the X direction on the flexible base material 111 side in the same manner as in FIG.

14. The length in the X direction of the hole 110a is W15. The length in the Y direction of the hole 110a is L15.

On the other hand, the length in the X direction of the hole 110b is W16. The length in the Y direction of the hole 110b is L16. The lengths W16 and L16 of the hole 110b are the same as the lengths W15 and L15 of the hole 110a, respectively.

The line P12 illustrates the phase of the center point of the hole 110a in the Y direction. The phase of the hole 110a in the Y direction in FIG. 15 differs from the phase of the hole 110b. Further, the hole 110a and the hole 110b are arranged so as not to overlap each other in the X direction. Thus, also in the case of FIG. 15, at least a part of a region extending in the Y direction adjacent to the hole 110a is adjacent to the hole 110b in the X direction in the same manner as in the first embodiment.

When the hole 110a is defined as the first hole and the hole 110b is defined as the second hole, the first hole and the second hole are spaced apart from each other in the X direction, and the insulator region adjacent to the first hole in the Y direction is adjacent to at least a part of the second hole in the Y direction in all the patterns of the hole forming patterns illustrated in FIG. 10 to FIG. 15. This is the same as the hole forming pattern described in the above first and second embodiments.

Thus, when the hole 110a and the hole 110b are formed in at least one surface of the flexible wiring board 110 as illustrated in FIG. 10 to FIG. 15, the same advantageous effects as those in the first and second embodiments described above can be achieved. Note that the pattern forming the plurality of holes in the surface of the flexible wiring board 110 is not limited to the patterns described above. For example, the length of the hole 110a may not be the same as the length of the hole 110b in the X direction. A region adjacent to the hole 110a in the Y direction, that is, the region without holes formed is arranged so as to be adjacent to the hole 110b in the X direction. Further, the length of a hole of the first hole group may differ from the length of a hole of the second hole group in the Y direction. For example, holes may be formed such that the alignment of a plurality of holes 110a in the first hole group and the alignment of a plurality of holes 110b in the second hole group have the same phase in the Y direction, and in addition, the hole 110a has a different length from the hole 110b in the Y direction.

EXAMPLE 1

As the imaging module 100 of Example 1, the imaging module 100 according to the first embodiment illustrated in FIG. 1, FIG. 2, FIG. 3, and FIG. 4 was manufactured. In the imaging module 100 of Example 1, a resin having a thickness of 2 mm was used for the frame 124. A rectangular, planar CMOS image sensor of 30 mm×20 mm was used for the imaging sensor device 122. A rectangular, planar cover glass of 28 mm×38 mm was used for the cover glass 123.

The flexible wiring board 110 in which the material of the flexible base material 111 and the cover lay 113 was polyimide and the material of the flexible wiring layer 112 and the first electrodes 115 was Cu was used. The thickness of the flexible base material 111 was 25 μm, the thickness of the cover lay 113 was 12 μm, the thickness of the flexible wiring layer 112 was 18 μm, and the thickness of the adhesive agent 114 was 18 μm. An epoxy-based adhesive agent was used for the adhesive agent 114. The position of the end of the cover lay 113 was located 1.5 mm away from the end of the flexible base material 111.

In the flexible wiring layer 112, the electrode pitch was 0.2 mm, the electrode width was 0.1 mm, and the number of wirings was 80. The width of the flexible wiring board 110 was 22 mm, which was larger than the opening width of 20 mm of the solder resist layer 121c.

The hole forming region A1 was formed in a region of a width of 1 mm in a range of 1 mm to 2 mm from the end of the cover lay 113. The holes 110a were formed in the flexible base material 111 in the hole forming region A1, and the holes 110b were formed in the cover lay 113, respectively, by a UV laser processing machine.

For the holes 110a, two columns of 79 holes were formed, the depth was 45 μm from the front surface side of the flexible base material 111 where no flexible wiring layer 112 was formed directly under, the diameter Φ was 75 μm so that a part of the hole did not reach the flexible wiring layer 112, the pitch was 0.2 mm in a direction orthogonal to the wiring, and the pitch of the columns was 0.4 mm in the wiring direction.

For the holes 110b, one column of 80 holes was formed at the intermediate position of the holes 110a, the depth was 10 μm from the front surface side of the cover lay 113 where the flexible wiring layer 112 was formed directly under, the diameter Φ was 75 μm, and the pitch was 0.2 mm in the direction orthogonal to the wiring. That is, the hole 110b was shifted by a phase of 0.1 mm from the hole 110a.

The printed wiring board 121 having a rectangular external shape of 30 mm×40 mm in which the material of the printed wiring base material 121a was a glass epoxy material and the material of the wiring layer 121b and the second electrodes 127 was Cu was used. Each thickness of the wiring layer 121b and the second electrodes 127 was about 30 μm, and the thickness of the solder resist layer 121c was about 25 μm. Further, a UV curable resin was used for the adhesive agent for securing the printed wiring board 121 to the frame 124. The frame 124 having the external shape of 50 mm×60 mm was used.

The first electrodes 115 of the flexible wiring board 110 and the second electrodes 127 of the printed wiring board 121 were connected by the solder 141. In the second electrodes 127, the electrode pitch was 0.2 mm, the electrode width was 0.15 mm, and the number of wirings was 80. Further, the opening 121e of the solder resist layer 121c exposed by the second electrodes 127 had a size of 1.1 mm×20 mm. On the other hand, in the first electrodes 115, the electrode pitch was 0.2 mm, the electrode width was 0.1 mm, and the number of wirings was 80. The wide of the flexible wiring board 110 was 22 mm, which was larger than the opening width of 20 mm of the solder resist layer 121c. The electrode pitch, the electrode width, the distance between electrodes, and the number of electrodes were suitably set in accordance with the specification of the sensor unit 120.

The clearance between the cover lay 113 and the solder 141 was 1 mm. The solder 141 whose material was Sn-3.0-Ag-0.5Cu was used. The image stabilizer unit 130 having an L-shape obtained by cutting a rectangular of 70 mm×55 mm from a rectangular of 85 mm×70 mm was used.

The imaging apparatus on which the completed imaging module 100 of Example 1 was mounted was able to reduce a stress occurring at the connection part 140 between the flexible wiring board 110 and the printed wiring board 121 without interfering with driving of the image stabilizer unit 130. Further, the above imaging apparatus was able to sufficiently ensure the reliability of connection at the connection part 140 and the optical performance of a CMOS image sensor built in the imaging module 100.

EXAMPLE 2

Figure 8:
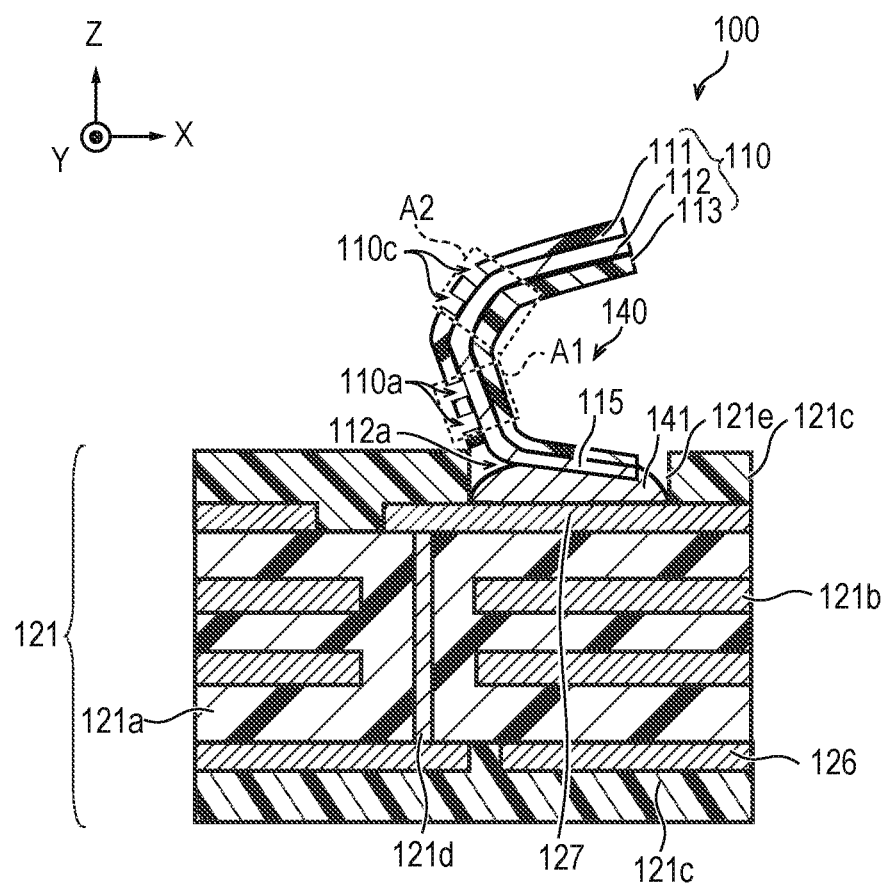
FIG. 8 is an enlarged sectional view of a main part of the imaging module illustrated in FIG. 7.

As the imaging module 100 of Example 2, the imaging module 100 according to FIG. 5, FIG. 6A to FIG. 6D, FIG. 7, and FIG. 8 was manufactured. In the imaging module 100 of Example 2, the flexible wiring board 110 was drawn to the opposite side of the image stabilizer unit 130 and once folded back, as illustrated in FIG. 8.

The flexible wiring board 110 in which the material of the flexible base material 111 and the cover lay 113 was polyimide and the material of the flexible wiring layer 112 and the first electrodes 115 was Cu was used. The thickness of the flexible base material 111 was 25 μm, the thickness of the cover lay 113 was 25 μm, the thickness of the flexible wiring layer 112 was 18 μm, and the thickness of the adhesive agent 114 was 18 μm. An epoxy-based adhesive agent was used for the adhesive agent 114. The position of the end of the cover lay 113 was located 1.5 mm away from the end of the flexible base material 111.

The hole forming region A1 was formed in a region of a width of 2 mm in a range of 1 mm to 3 mm from the end of the cover lay 113. The hole forming region A2 was formed in a region of a width of 4 mm in a range of 10 mm to 14 mm from the end of the cover lay 113. The holes 110a and the holes 110b were formed in the flexible base material 111 in the hole forming region A1, and the holes 110c and the holes 110d were formed in the hole forming region A2, respectively, by a UV laser processing machine.

For the holes 110a, three columns of 40 holes were formed, the depth was 50 μm from the outer surface of the flexible base material 111 where the flexible wiring layer 112 was not formed directly under, the diameter Φ was 75 μm so that a part of the hole did not reach the flexible wiring layer 112, the pitch was 0.4 mm in a direction orthogonal to the wiring, and the pitch of the columns was 0.4 mm in the wiring direction. The holes 110b were shifted by a phase of 0.2 mm from the holes 110a, and two columns of 39 holes were formed, the depth was 50 μm from the outer surface of the flexible base material 111 where no flexible wiring layer 112 was formed directly under, the diameter Φ was 75 μm so that a part of the hole did not reach the flexible wiring layer 112, the pitch was 0.4 mm in the direction orthogonal to the wiring, and the pitch of the columns was 0.4 mm in the wiring direction.

For the holes 110c, in the same manner as the holes 110a, three columns of 40 holes were formed, the depth was 50 μm from the outer surface of the flexible base material 111 where no flexible wiring layer 112 was formed directly under, the diameter Φ was 75 μm so that a part of the hole did not reach the flexible wiring layer 112, the pitch was 0.4 mm in a direction orthogonal to the wiring, and the pitch of the columns was 0.4 mm in the wiring direction.

The holes 110d were shifted by a phase of 0.2 mm from the holes 110c, and two columns of 39 holes were formed, the depth was 50 μm from the outer surface of the flexible base material 111 where no flexible wiring layer 112 was formed directly under, the diameter Φ was 75 μm so that a part of the hole did not reach the flexible wiring layer 112, the pitch was 0.4 mm in the direction orthogonal to the wiring, and the pitch of the columns was 0.4 mm in the wiring direction.

The same features as Example 1 were used except for the above. The imaging apparatus on which the completed imaging module 100 of Example 2 was mounted was able to sufficiently ensure the optical performance of the built-in CMOS image sensor. Further, even with the bent flexible wiring board 110, the imaging apparatus on which the completed imaging module 100 of Example 2 was mounted was able to reduce a stress occurring at the connection part 140 between the flexible wiring board 110 and the printed wiring board 121 without interfering with driving of the image stabilizer unit 130 and sufficiently ensure the reliability of connection at the connection part 140.

[Evaluation by Structural Analysis]

Figure 16:
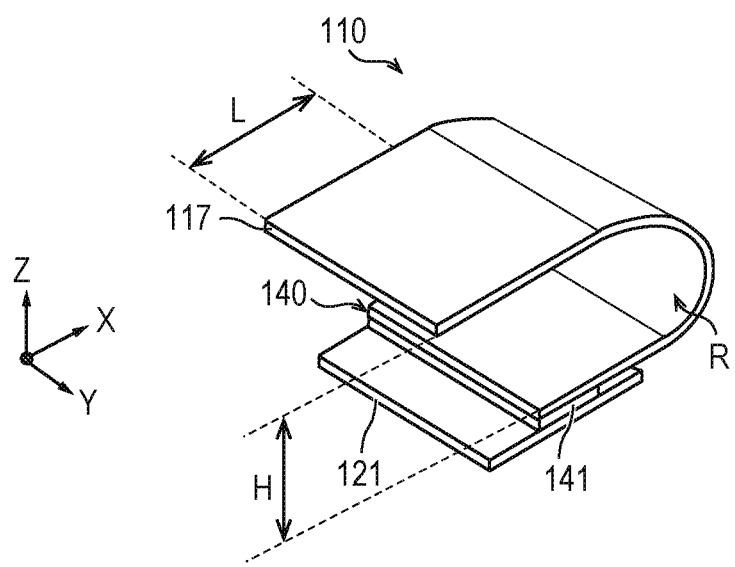
FIG. 16 is a perspective view illustrating a general configuration of a flexible wiring board according to analysis examples.

To confirm the advantageous effect of the present invention, an example of analysis on structure having the folded flexible wiring board 110 will be illustrated with simplified structure including the flexible wiring board 110, the printed wiring board 121, and the solder 141. FIG. 16 is a perspective view illustrating the simplified structure. In the analysis, the end face of the flexible wiring board 110 on the side not connected to the solder 141 is the fixing face 117, as described later.

Figure 17A:
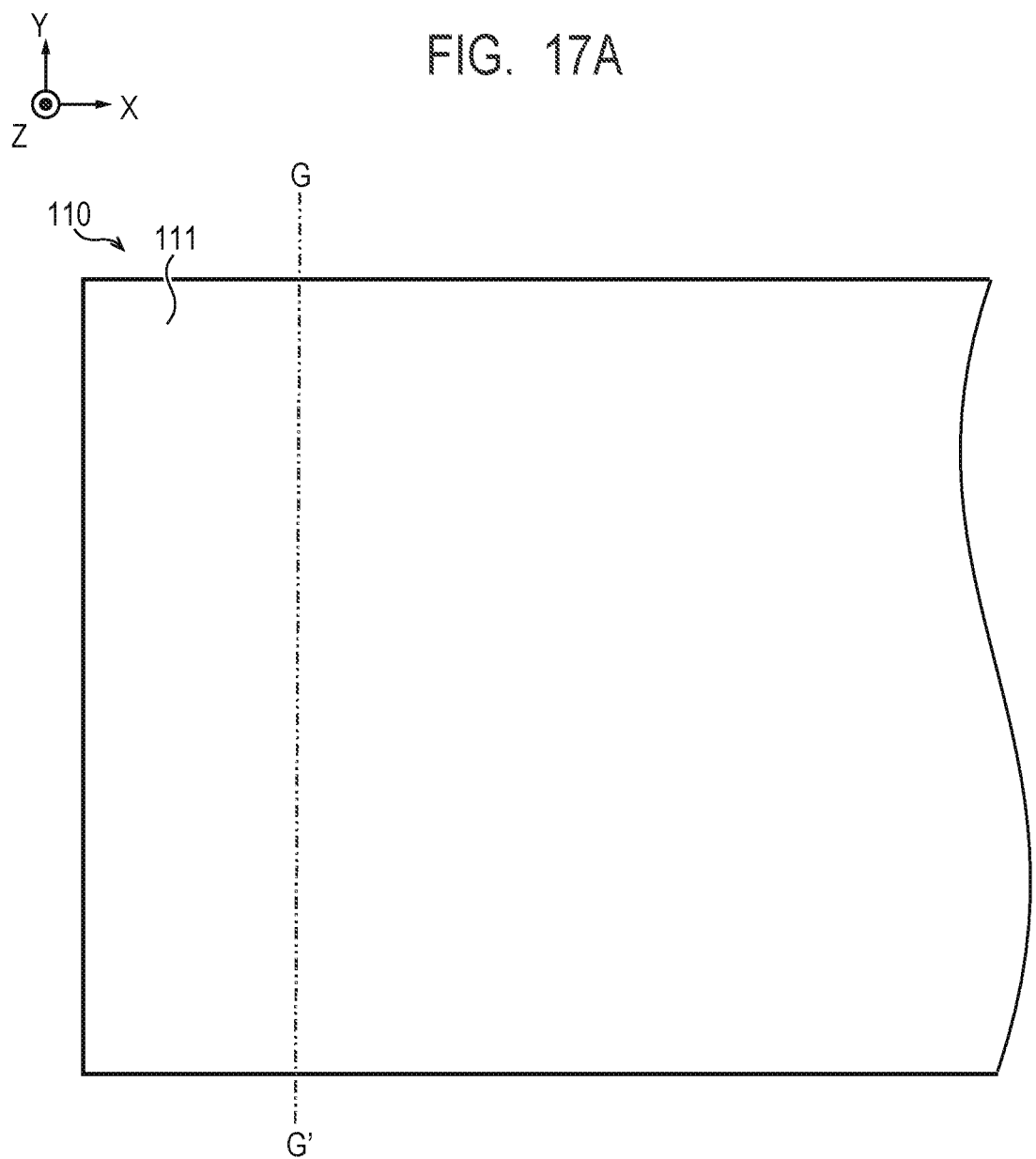
FIG. 17A is a top view illustrating a general configuration of a flexible wiring board according to Analysis example 1.
Figure 17B:
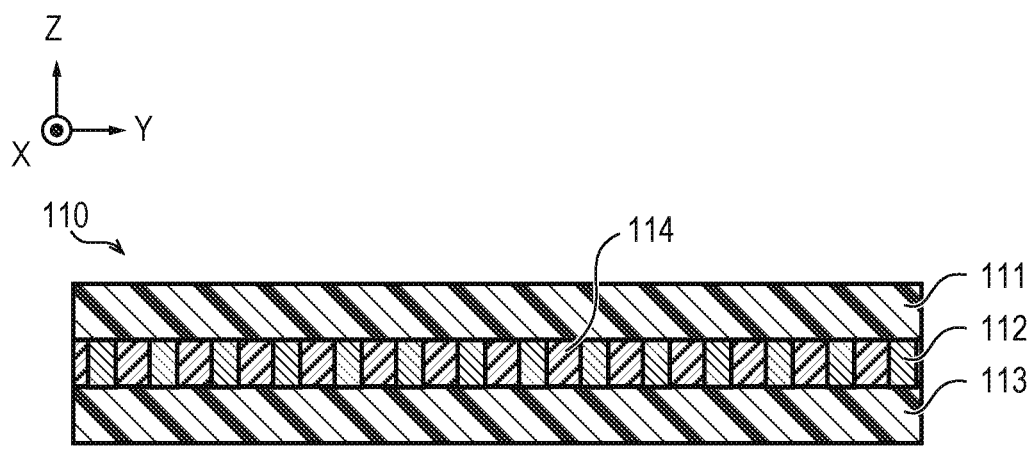
FIG. 17B is a sectional view taken along a line G-G' illustrated in FIG. 17A.

FIG. 17A is a top view illustrating the general configuration of the flexible wiring board 110 according to Analysis example 1. FIG. 17B is a sectional view taken along the line G-G' illustrated in FIG. 17A. The flexible wiring board 110 in Analysis example 1 has the structure without the hole forming region A1.

Figure 18B:
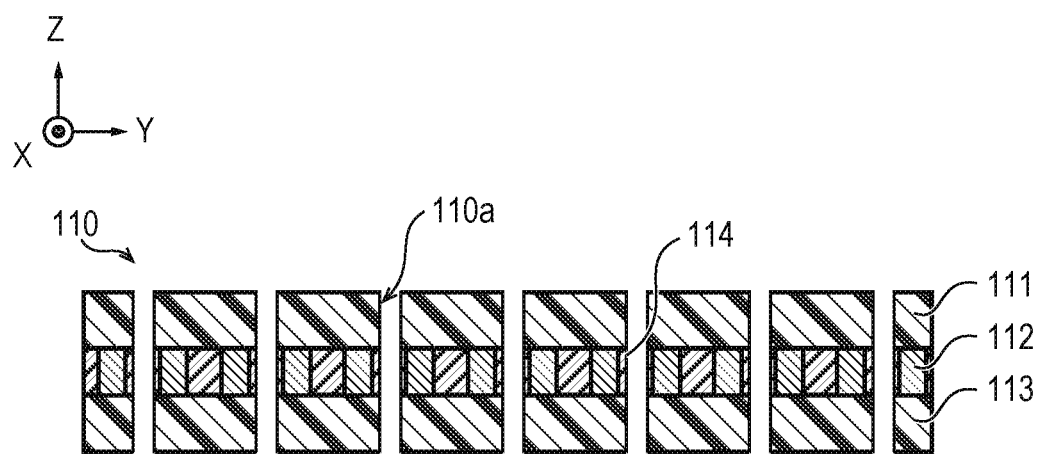
FIG. 18B is a sectional view taken along a line G-G' illustrated in FIG. 18A.

FIG. 18A is a top view illustrating the general configuration of the flexible wiring board 110 according to Analysis example 2. FIG. 18B is a sectional view taken along the line G-G' illustrated in FIG. 18A. The flexible wiring board 110 in Analysis example 2 has the structure with only one column of the plurality of holes 110a formed in hole forming region A1.

Further, Analysis example 3 and Analysis example 4 have the structure with three columns of a plurality of holes formed in the hole forming region A1.

Figure 19B:
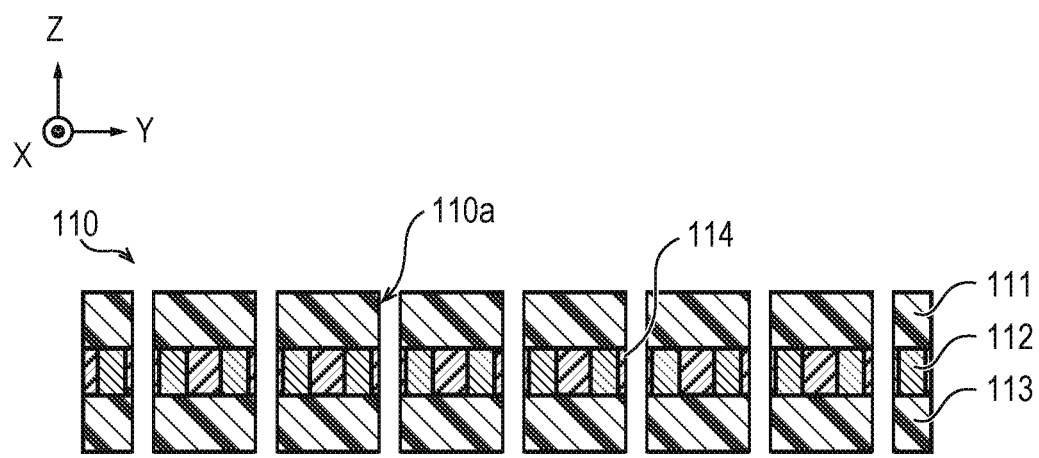
FIG. 19B is a sectional view taken along a line G-G' illustrated in FIG. 19A.

FIG. 19A is a top view illustrating the general configuration of the flexible wiring board 110 according to Analysis example 3. FIG. 19B is a sectional view taken along the line G-G' illustrated in FIG. 19A. The flexible wiring board 110 in Analysis example 3 has the structure in which the first column C1 to the third column C3 have the same phase of the plurality of holes 110a.

Figure 20A:
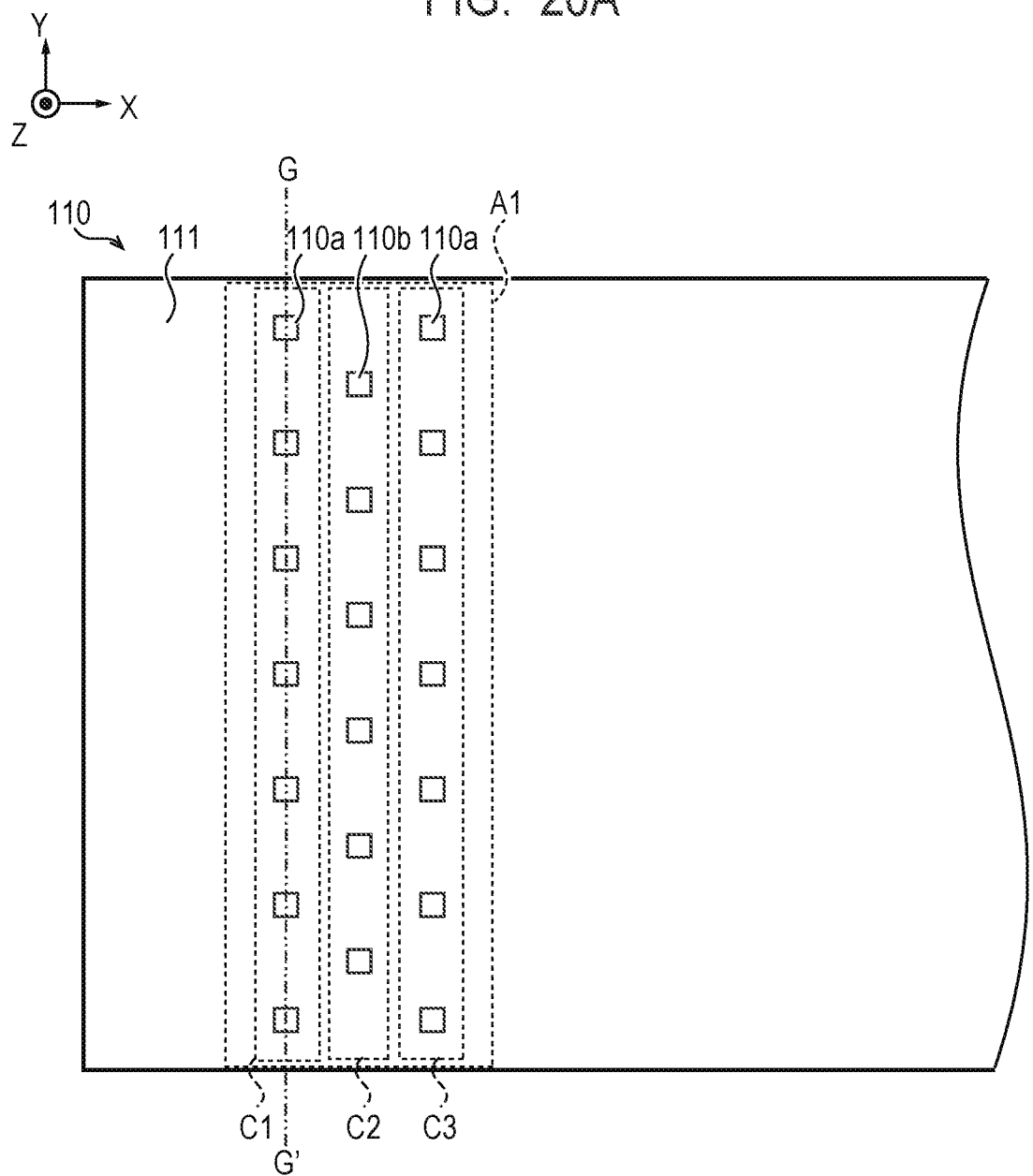
FIG. 20A is a top view illustrating a general configuration of a flexible wiring board according to Analysis example 4.
Figure 20B:
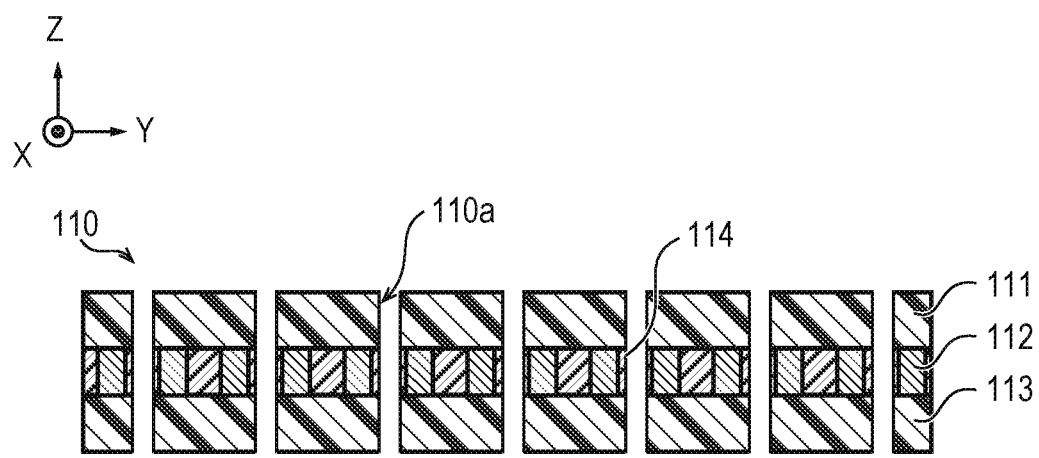
FIG. 20B is a sectional view taken along a line G-G' illustrated in FIG. 20A.

FIG. 20A is a top view illustrating the general configuration of the flexible wiring board 110 according to Analysis example 4. FIG. 20B is a sectional view taken along the line G-G' illustrated in FIG. 20A. In the flexible wiring board 110 in Analysis example 4, the phase of the plurality of holes 110a on the first column C1 is the same as the phase of the plurality of holes 110a on the third column C3, and the phase of the plurality of holes 110a is different from the phase of the plurality of holes 110b on the second column C2 in the hole forming region A1.

Furthermore, in Analysis example 5 and Analysis example 6, the hole forming region A2 is formed in addition to the hole forming region A1.

Figure 21A:
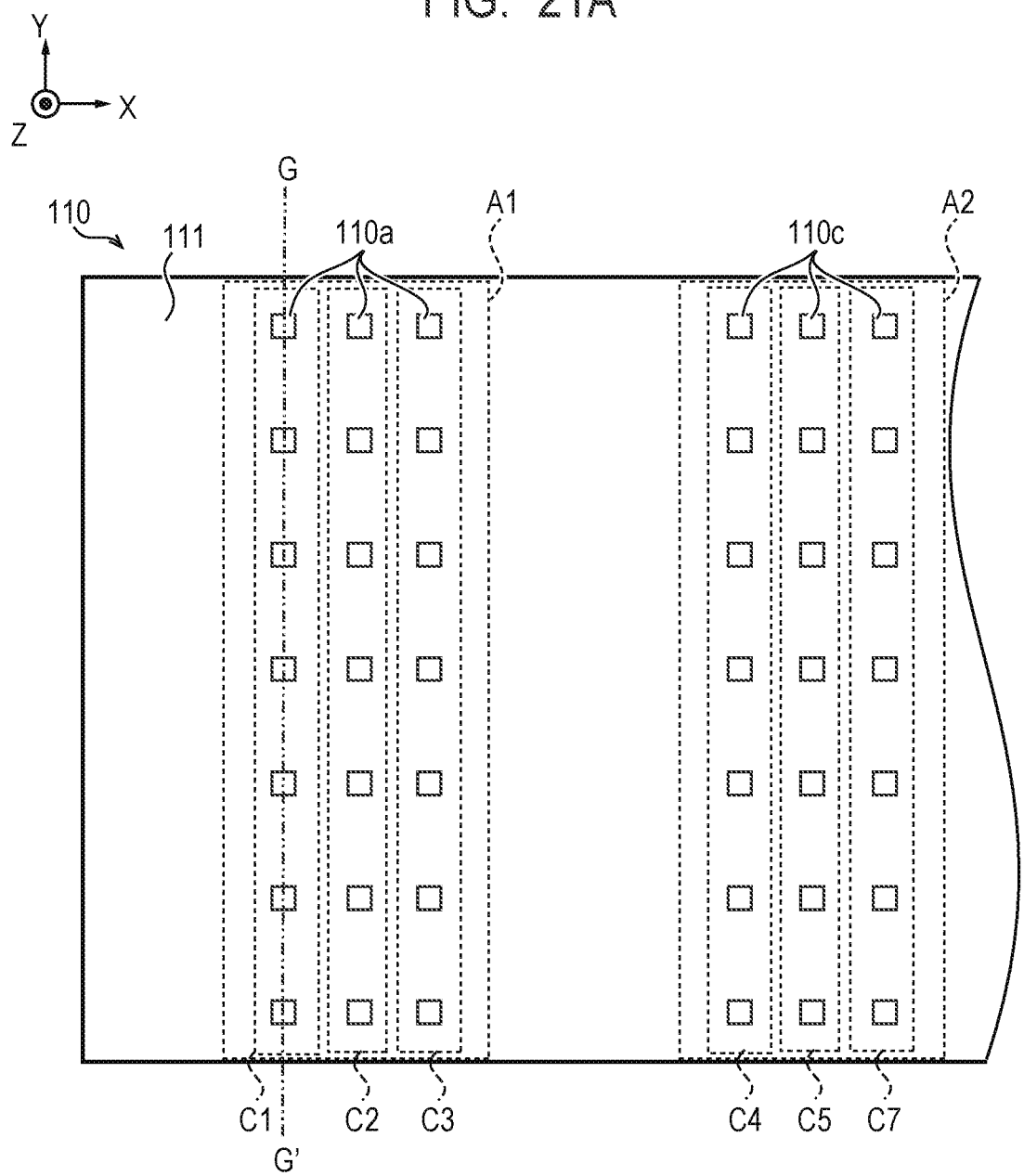
FIG. 21A is a top view illustrating a general configuration of a flexible wiring board according to Analysis example 5.
Figure 21B:
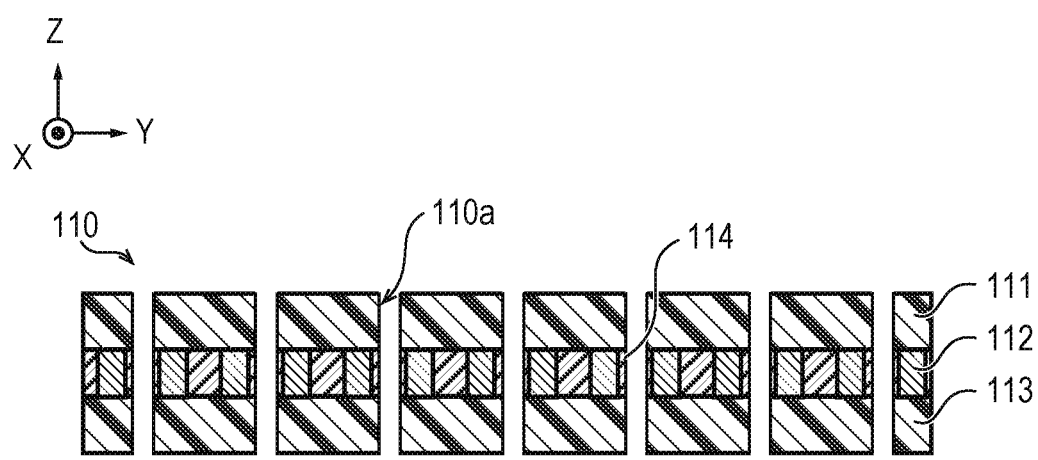
FIG. 21B is a sectional view taken along a line G-G' illustrated in FIG. 21A.

FIG. 21A is a top view illustrating the general configuration of the flexible wiring board 110 according to Analysis example 5. FIG. 21B is a sectional view taken along the line G-G' illustrated in FIG. 21A. In the flexible wiring board 110 in Analysis example 5, the phases of the plurality of holes 110a on the first column C1, the second column C2, and the third column C3 are the same in the hole forming region A1. The phases of the plurality of holes 110c on the fourth column C4, the fifth column C5, and the sixth column C6 are the same in the hole forming region A2. Further, the phase of the plurality of holes 110a in the hole forming region A1 is the same as the phase of the plurality of holes 110c in the hole forming region A2. That is, in the flexible wiring board 110 in Analysis example 5, the structure having the same phase as the hole forming region A1 is added to the hole forming region A2.

Figure 22A:
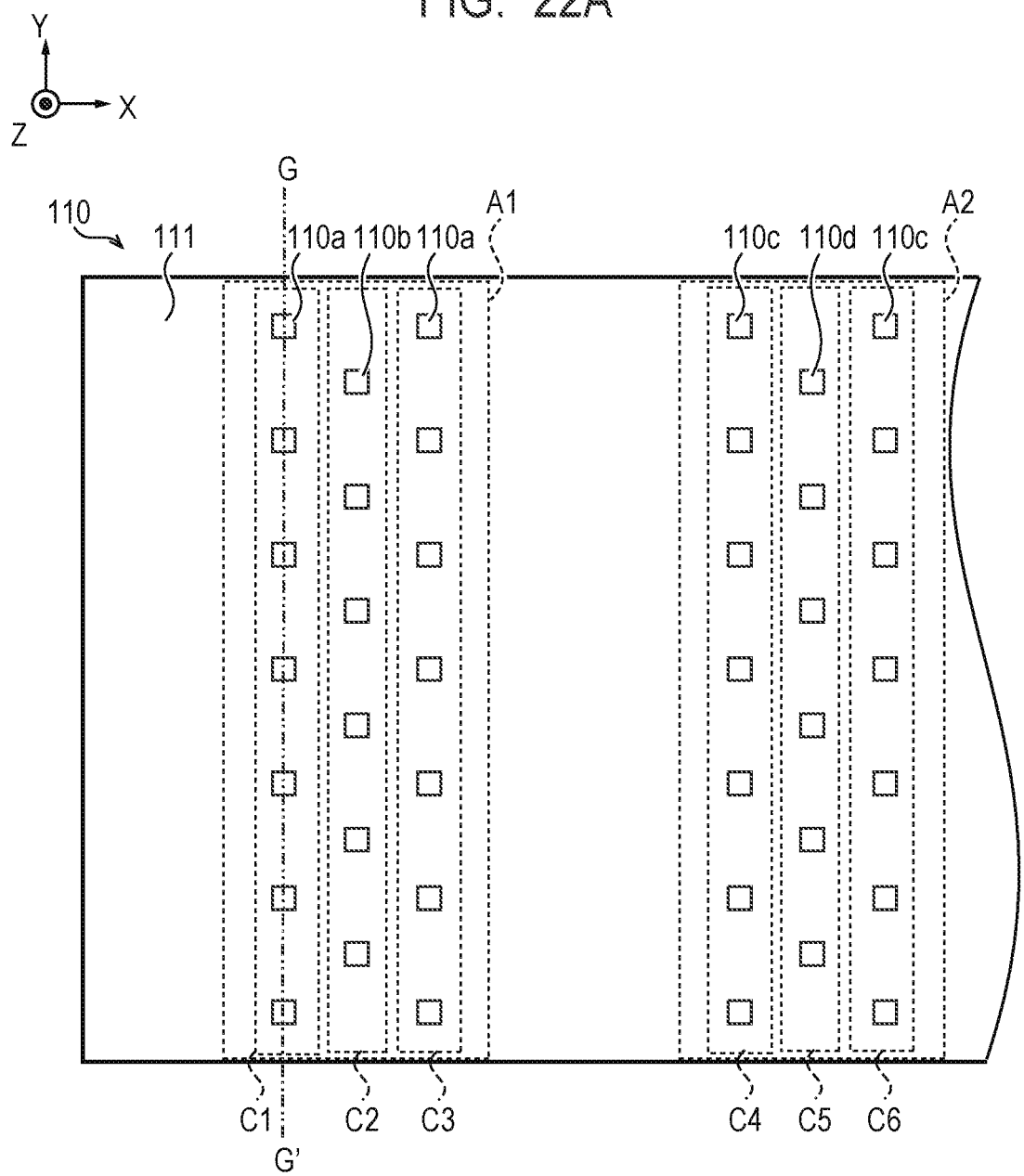
FIG. 22A is a top view illustrating a general configuration of a flexible wiring board according to Analysis example 6.
Figure 22B:
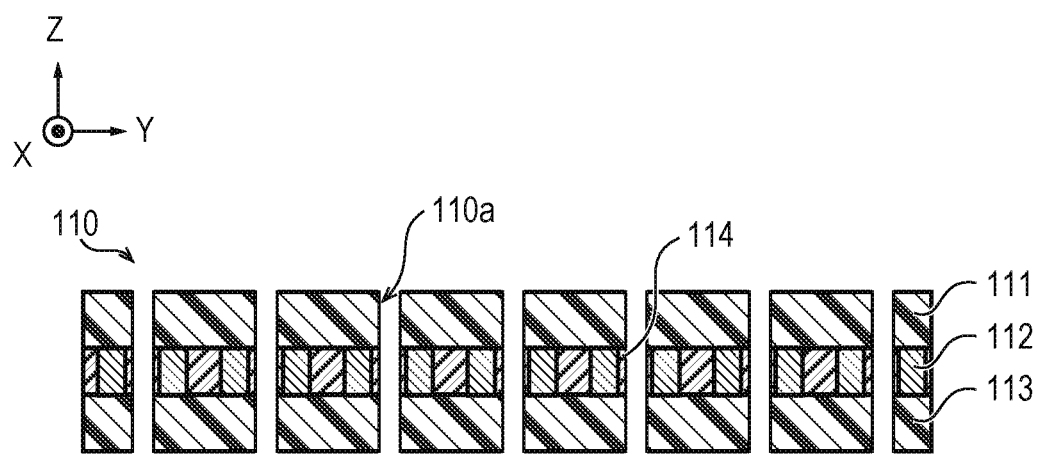
FIG. 22B is a sectional view taken along a line G-G' illustrated in FIG. 22A.

FIG. 22A is a top view illustrating the general configuration of the flexible wiring board 110 according to Analysis example 6. FIG. 22B is a sectional view taken along the line G-G' illustrated in FIG. 22A. In the flexible wiring board 110 in Analysis example 6, the phases of the plurality of holes 110a on the first column C1 and the third column C3 are the same in the hole forming region A1. However, the phases of the plurality of holes 110a on the first column C1 and the third column C3 are different from the phase of the plurality of holes 110b on the second column C2. Further, the phases of the plurality of holes 110c on the fourth column C4 and the sixth column C6 are the same in the hole forming region A2. However, the phases of the plurality of holes 110c on the fourth column C4 and the sixth column C6 are different from the phase of the plurality of holes 110d on the fifth column C5. The phase of the plurality of holes 110a in the hole forming region A1 is the same as the phase of the plurality of holes 110c in the hole forming region A2. The phase of the plurality of holes 110b in the hole forming region A1 is the same as the phase of the plurality of holes 110d in the hole forming region A2.

The structural analysis scheme used in evaluation will be described. The structural analysis software of ANSYS Mechanical Enterprise Version 19.1 was used. The structural analysis of three-dimensional analysis was performed.

Next, respective sizes or the like used in the structural analysis will be described. The printed wiring board 121 had a length of 23 mm, a width of 3 mm, and a thickness of 0.8 mm. The flexible wiring board 110 had a length of 22 mm, a width of 7 mm, and the thickness of 0.05 mm assuming that the flexible base material 111, the flexible wiring layer 112, and the cover lay 113 were simplified as a polyimide substrate having an even thickness of 50 μm.

The solder 141 had a length of 1 mm from the end of the flexible wiring board 110 at the center of the printed wiring board 121 in the X direction, expanded across both ends of the flexible wiring board 110 in the Y direction, and had a solder height of 50 μm in the Z direction. The curvature R of the folded part was 0.5 mm, the distance H in the Z direction formed by the folded flexible wiring board 110 was 1 mm, and the length L in the X direction of the planar part continued from the folded part was 2 mm.

Each of all the holes was shaped in a rectangular through hole of 0.1 mm×0.1 mm. The number of holes was 40. The pitch in the Y direction of the hole 110a was 0.5 mm, and the distance in the X direction between the holes 110a, the holes 110b, the holes 110c, and the holes 110d was 0.25 mm. In Analysis example 4 and Analysis example 6, the holes 110a were shifted by a phase of 0.25 mm from the holes 110b, and the holes 110c were shifted by a phase of 0.25 mm from the holes 110d. The hole forming region A1 was positioned such that the center of the holes 110a in the X direction was distant by 0.5 mm from the joining end of the solder 141. The hole forming region A2 was positioned such that the center of the second column of the holes 110c matched the bending center of the flexible wiring board 110 in the X direction.

Figure 23:
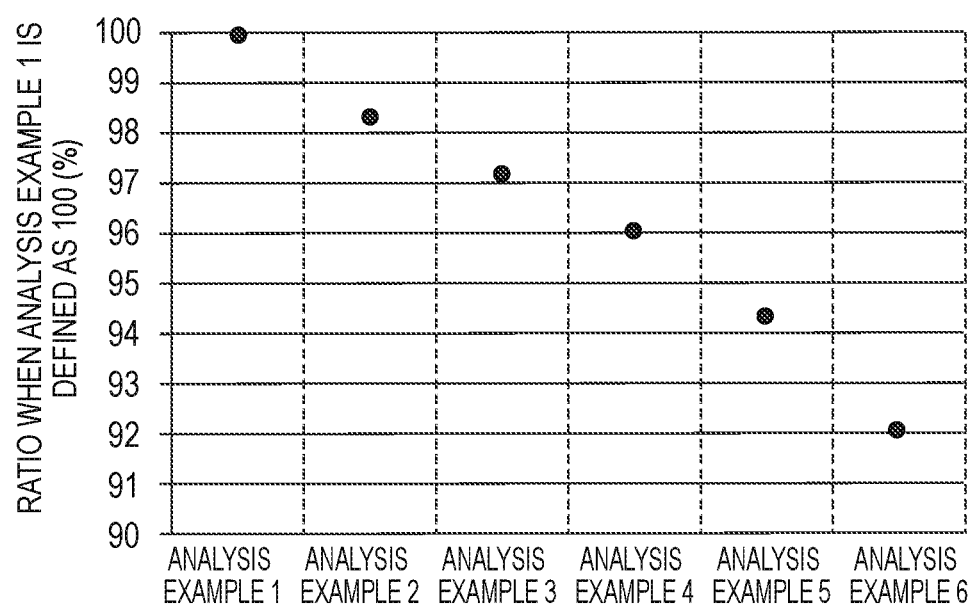
FIG. 23 is a diagram illustrating comparison of results of structural analysis of Analysis examples 1 to 6.

In the analysis, comparison was performed on counterforce of the fixing face 117 of Analysis example 1 to Analysis example 6 when the flexible wiring board 110 was rotated by ±1 degree in the θ direction about the center in the Y direction of the fixing face 117, where an end face of the flexible wiring board 110 on the side not connected to the solder 141 is the fixing face 117. FIG. 23 illustrates the analysis result from the structural analysis.

In FIG. 23, 100% on the evaluation axis (vertical axis) corresponds to the evaluation value of Analysis example 1 in which no hole is formed in the surface of the flexible wiring board 110, and Analysis example 1 was compared to Analysis examples 2 to 6. As illustrated in FIG. 23, it is understood that Analysis example 4 can reduce the counterforce over Analysis examples 1, 2, and 3.

That is, the advantageous effect of a reduction in the stress against the connection part 140 was verified. Further, it can be seen that Analysis example 6 can reduce the counterforce over Analysis example 5. That is, the advantageous effect of a reduction in the stress against the connection part 140 was verified.

As described above, according to the present invention, it was confirmed that it is possible to improve the flexibility of the flexible wiring board 110 and reduce a stress at the connection part 140 between the flexible wiring board 110 and the printed wiring board 121.

The embodiments described above can be changed as appropriate within the scope not departing from the technical concept. For example, a plurality of embodiments can be combined. Further, some feature of at least one embodiment can be deleted or replaced. Further, a new feature can be added to at least one embodiment.

Note that the disclosed content of the present specification includes all the features that can be recognized from the present specification and the drawings attached to the present specification without being limited to what is explicitly described in the present specification. Further, the disclosed content of the present specification includes a complementary set of individual concepts described in the present specification. That is, when there is an expression to the effect that "A is B" in the present specification, for example, it can be said that the present specification discloses that "A is not B" even when the expression to the effect that "A is not B" is omitted. This is because, when there is an expression to the effect that "A is B", it is assumed that the case where "A is not B" is taken into consideration.

According to the present invention, it is possible to provide a technology that is advantageous in achieving both flexibility and strength of a flexible wiring board.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-074465, filed Apr. 26, 2021, which is hereby incorporated by reference herein in its entirety.

What is claimed is:

1. A flexible wiring board comprising:
an insulator; and
a wiring layer supported by the insulator,
and further comprising:
a first terminal unit including a plurality of connection terminals provided at one end of the wiring layer; and
a second terminal unit including a plurality of connection terminals provided at the other end of the wiring layer,
wherein the insulator includes a first insulator layer and a second insulator layer,
wherein a portion of the wiring layer from a part adjacent to the first terminal unit to a part adjacent to the second terminal unit is provided between the first insulator layer and the second insulator layer, wherein a first hole and a second hole formed in the first insulator layer or the second insulator layer are provided in an intermediate portion in a first direction from the first terminal unit to the second terminal unit, wherein the first hole and the second hole are spaced apart from each other in the first direction, and wherein an insulator region adjacent to the first hole in a second direction intersecting the first direction is adjacent to at least a part of the second hole in the first direction.

2. The flexible wiring board according to claim 1, wherein the insulator region is located between the first hole and third holes aligned parallel to the first hole in the second direction, and the first hole is provided between wiring patterns included in the wiring layer.

3. The flexible wiring board according to claim 1, wherein at least a part of the second hole overlaps the insulator region in side view from the first direction.

4. The flexible wiring board according to claim 1, wherein a length of the insulator region is longer than a length in the second direction of the second hole.

5. The flexible wiring board according to claim 1, wherein a length of the insulator region is shorter than a length in the second direction of the second hole.

6. The flexible wiring board according to claim 1,
wherein the insulator region is defined as a first insulator region, and the first insulator region is adjacent to the second hole in the second direction, and
wherein a length in the second direction of a second insulator region adjacent to at least a part of the first hole in the first direction is longer than a length in the second direction of the second hole.

7. The flexible wiring board according to claim 6, wherein a length of the first insulator region is longer than the length in the second direction of the second insulator region.

8. The flexible wiring board according to claim 6, wherein a length of the first insulator region is shorter than the length in the second direction of the second insulator region.

9. The flexible wiring board according to claim 1 comprising:
a first hole group in which a plurality of holes including the first hole are aligned in the second direction at a predetermined pitch; and
a second hole group in which a plurality of holes including the second hole are aligned in the second direction at a predetermined pitch and which is spaced apart from the first hole group in the first direction.

10. The flexible wiring board according to claim 9, wherein the pitch in the first hole group is the same as the pitch in the second hole group.

11. The flexible wiring board according to claim 9, wherein the pitch in the first hole group is different from the pitch in the second hole group.

12. The flexible wiring board according to claim 9, wherein in the second direction, an alignment of the plurality of holes in the first hole group and an alignment of the plurality of holes in the second hole group have different phases from each other.

13. The flexible wiring board according to claim 9,
wherein in the second direction, an alignment of the plurality of holes in the first hole group and an alignment of the plurality of holes in the second hole group have the same phase, and wherein a length of the first hole differs from a length in the second direction of the second hole.

14. The flexible wiring board according to claim 9 comprising a third hole group in which a plurality of holes are aligned in the second direction at a predetermined pitch, wherein the third hole group is arranged on the opposite side to the first hole group with respect to the second hole group in the first direction in plan view.

15. The flexible wiring board according to claim 14, wherein the flexible wiring board satisfies at least one of the following conditions that:
the pitch in the third hole group is the same as the pitch in the first hole group; and
the alignment of the plurality of holes in the first hole group and the alignment of the plurality of holes in the third hole group have the same phase in the second direction.

16. The flexible wiring board according to claim 1, wherein a length in the first direction of the first hole is longer than a length in the second direction of the first hole.

17. The flexible wiring board according to claim 1, wherein each of the first hole and the second hole is a bottomed hole.

18. The flexible wiring board according to claim 1,
wherein the first hole is a bottomed hole which penetrates the first insulator layer and whose bottom is formed by the second insulator layer or a bottomed hole which penetrates the second insulator layer and whose bottom is formed by the first insulator layer, and
wherein the second hole is a bottomed hole which penetrates the first insulator layer and whose bottom is formed by the second insulator layer or a bottomed hole which penetrates the second insulator layer and whose bottom is formed by the first insulator layer.

19. The flexible wiring board according to claim 1, wherein each of the first hole and the second hole is a through hole penetrating the first insulator layer and the second insulator layer.

20. A module comprising:
the flexible wiring board according to claim 1;
a first unit connected to the first terminal unit of the flexible wiring board; and
a second unit connected to the second terminal unit of the flexible wiring board.

21. The module according to claim 20, wherein the flexible wiring board is bent at a position where the first hole and the second hole are formed.

22. The module according to claim 20, wherein the flexible wiring board is connected to the first unit by solder in contact with the first terminal unit.

23. The module according to claim 20, wherein the first unit includes an imaging device.

24. An electronic device comprising:
the module according to claim 20; and
a third unit that moves the first unit.

25. An electronic device comprising:
the module according to claim 20; and
a casing that contains the module.

* * * * *

UNITED STATES PATENT AND TRADEMARK OFFICE
CERTIFICATE OF CORRECTION

PATENT NO. : 11,877,392 B2
APPLICATION NO. : 17/725803
DATED : January 16, 2024
INVENTOR(S) : Mitsutoshi Hasegawa et al.

It is certified that error appears in the above-identified patent and that said Letters Patent is hereby corrected as shown below:

On the Title Page

Item (73) In the Assignee:
"CANON KABU KIKA HA KAISHA, Tokyo(JP)" should read --CANON KABUSHIKI KAISHA, Tokyo(JP)--

Signed and Sealed this
Sixteenth Day of April, 2024

Katherine Kelly Vidal
*Director of the United States Patent and Trademark Office*